US011758297B2

(12) United States Patent
Gutierrez Barragan et al.

(10) Patent No.: US 11,758,297 B2
(45) Date of Patent: Sep. 12, 2023

(54) SYSTEMS, METHODS, AND MEDIA FOR HIGH DYNAMIC RANGE IMAGING USING SINGLE-PHOTON AND CONVENTIONAL IMAGE SENSOR DATA

(71) Applicant: Wisconsin Alumni Research Foundation, Madison, WI (US)

(72) Inventors: Felipe Gutierrez Barragan, Alameda, CA (US); Yuhao Liu, Madison, WI (US); Atul Ingle, Madison, WI (US); Mohit Gupta, Madison, WI (US); Andreas Velten, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 17/572,236

(22) Filed: Jan. 10, 2022

(65) Prior Publication Data
US 2023/0224599 A1    Jul. 13, 2023

(51) Int. Cl.
*H04N 25/585* (2023.01)
*H01L 27/146* (2006.01)

(52) U.S. Cl.
CPC ..... *H04N 25/585* (2023.01); *H01L 27/14634* (2013.01); *H01L 27/14645* (2013.01)

(58) Field of Classification Search
CPC ............ H04N 25/585; H01L 27/14634; H01L 27/14645
See application file for complete search history.

(56) References Cited

U.S. PATENT DOCUMENTS

| 10,616,512 B2 | 4/2020 | Ingle |
| 11,170,549 B2 | 11/2021 | Gupta |
| 11,539,895 B1 * | 12/2022 | Seets ...................... H04N 23/71 |
| 2021/0319606 A1 * | 10/2021 | Gupta ................... G06T 3/0093 |

OTHER PUBLICATIONS

Asatsuma, et al., "Sub-pixel architecture of cmos image sensor achieving over 120 db dynamic range with less motion artifact characteristics," In Proceedings of the 2019 International Image Sensor Workshop, vol. 1, 2019.

(Continued)

*Primary Examiner* — Antoinette T Spinks
(74) *Attorney, Agent, or Firm* — Quarles & Brady, LLP

(57) ABSTRACT

In accordance with some embodiments, systems, methods, and media for high dynamic range imaging using single-photon and conventional image sensor data are provided. In some embodiments, the system comprises: first detectors configured to detect a level of photons proportional to incident photon flux; second detectors configured to detect arrival of individual photons; a processor programmed to: receive, from the first detectors, first values indicative of photon flux from a scene with a first resolution; receive, from the second detectors, second values indicative of photon flux from the scene with a lower resolution; provide a first encoder of a trained machine learning model first flux values based on the first values, provide the second encoder of the model second flux values; receive, as output, values indicative of photon flux from the scene; and generate a high dynamic range image based on the third plurality of values.

21 Claims, 11 Drawing Sheets

(56) References Cited

OTHER PUBLICATIONS

Burt et al., "A multiresolution spline with application to image mosaics," ACM transactions on Graphics (1983).
Debevec, et al., "Recovering high dynamic range radiance maps from photographs," In ACM SIGGRAPH 2008 classes, pp. 1-10. 2008.
Eilertsen, et al., "Hdr image reconstruction from a single exposure using deep cnns," ACM transactions on graphics (TOG), 36(6):1-15, 2017.
Fossum, et al., "The quanta image sensor: Every photon Counts," Sensors, (2016).
Funt, et al., "The rehabilitation of maxrgb," in Color and Imaging Conference (2010)).
Funt, et al., "The effect of exposure on maxrgb color constancy," in Human Vision and Electronic Imaging (2010),.
Gardner, et al., "Learning to predict indoor illumination from a single image," arXiv preprint arXiv: 1704.00090 (2017) and are available at http(colon)//indoor(dot)hdrdb(dot)com.
Hasinoff, et al., "Noise-optimal capture for high dynamic range photography," In 2010 IEEE Computer Society Conference on Computer Vision and Pattern Recognition, pp. 553-560. IEEE, 2010.
Han, et al., "Neuromorphic camera guided high dynamic range imaging," In Proceedings of the IEEE/CVF Conference on Computer Vision and Pattern Recognition, pp. 1730-1739, 2020.
Liu, et al., "Single-image hdr reconstruction by learning to reverse the camera pipeline," In Proceedings of the IEEE/CVF Conference on Computer Vision and Pattern Recognition, pp. 1651-1660, 2020.
Mann, et al., "On being undigital with digital cameras: Extending dynamic range by combining differently exposed pictures, " In Proceedings of IS&T, pp. 442-448, 1995.
Marnerides, et al., "Expandnet: A deep convolutional neural network for high dynamic range expansion from low dynamic range content," In Computer Graphics Forum, vol. 37, pp. 37-49. Wiley Online Library, 2018.
Mase, et al., "A wide dynamic range cmos image sensor with multiple exposure-time signal outputs and 12-bit column-parallel cyclic a/d converters," IEEE Journal of Solid-State Circuits, 40(12):2787-2795, 2005.
Nayar, et al., "High dynamic range imaging: Spatially varying pixel exposures, " In Proceedings IEEE Conference on Computer Vision and Pattern Recognition. CVPR 2000 (Cat. No. PR00662), vol. 1, pp. 472-479. IEEE, 2000.
Santos, et al., "Single image hdr reconstruction using a cnn with masked features and perceptual loss," arXiv preprint arXiv:2005.07335 (2020).
Wang, et al., "Esgran: Enhanced super-resolution generative adversarial networks," arXiv preprint arXiv:1809.00219 (2018).

\* cited by examiner

SYSTEMS, METHODS, AND MEDIA FOR HIGH DYNAMIC RANGE IMAGING USING SINGLE-PHOTON AND CONVENTIONAL IMAGE SENSOR DATA

STATEMENT REGARDING FEDERALLY SPONSORED RESEARCH

This invention was made with government support under 1846884 awarded by the National Science Foundation and under DE-NA0003921 awarded by the US Department of Energy. The government has certain rights in the invention.

CROSS-REFERENCE TO RELATED APPLICATIONS

N/A

BACKGROUND

In general, conventional image sensors, such as image sensors based on charged-coupled device (CCD) or complementary semiconductor metal oxide (CMOS) technology, have a limited dynamic range.

Accordingly, new systems, methods, and media for high dynamic range imaging using single-photon and conventional image sensor data are desirable.

SUMMARY

In accordance with some embodiments of the disclosed subject matter, systems, methods, and media for high dynamic range imaging using single-photon and conventional image sensor data are provided.

In accordance with some embodiments of the disclosed subject matter, a system for generating high dynamic range digital images is provided, the system comprising: a first plurality of detectors, each configured to detect a level of photons arriving at the detector that is proportional to an incident photon flux at the detector, the first plurality of detectors arranged in a first array; a second plurality of detectors, each configured to detect arrival of individual photons, the second plurality of detectors arranged in a second array; at least one processor that is programmed to: receive, from the first plurality of detectors, first image data comprising a first plurality of values each indicative of photon flux from a portion of a scene corresponding to a respective detector of the first plurality of detectors, wherein the first image data has a first resolution; receive, from the second plurality of detectors, second image data comprising a second plurality of values each indicative of photon flux from a portion of the scene corresponding to a respective detector of the second plurality of detectors, wherein the second image data has a second resolution that is lower than the first resolution; provide, as input to a first encoder of a trained machine learning model, a first plurality of flux values based on the first plurality of values, wherein the trained machine learning model comprises the first encoder, a second encoder, and a decoder; provide, as input to the second encoder of the trained machine learning model, a second plurality of flux values based on the second plurality of values; receive, as output from the trained machine learning model, a third plurality of values each indicative of photon flux from a portion of the scene corresponding to a respective detector of the first plurality of detectors; and generate a high dynamic range image based on the third plurality of values.

In some embodiments, the system further comprises a CMOS image sensor that includes the first plurality of detectors.

In some embodiments, each detector of the second plurality of detectors comprises a single-photon detector.

In some embodiments, wherein each single-photon detector is configured to record a number of photons detected within an exposure time.

In some embodiments, the first resolution is at least four times greater than the second resolution.

In some embodiments, the trained machine learning model includes a first skip connection between a layer of the first encoder and a layer of the decoder, and a second skip connection between a layer of the second encoder and the layer of the decoder, wherein the trained machine learning model is configured to concatenate values from the layer of the first encoder and values from the layer of the second encoder.

In some embodiments, the at least one processor is further programmed to: estimate the first plurality of flux values using the first plurality of values and the relationship:

$$\hat{\Phi}^{CMOS} = \frac{\hat{N}_T^{CMOS}}{q_{CMOS}T},$$

where $\hat{\Phi}^{CMOS}$ is the estimated flux for the portion of the scene, $\hat{N}^{CMOS}_T$ is a value output by a detector of the first plurality of detectors, $q_{CMOS}$ is a sensitivity of the detector, and T is exposure time; and estimate the second plurality of flux values using the second plurality of values and the relationship:

$$\hat{\Phi}^{SPC} = \frac{\hat{N}^{SPC}_{T_{SPC}}/q_{SPAD}}{T_{SPC} - \tau_d \hat{N}^{SPC}_{T_{SPC}}},$$

where $\hat{\Phi}^{SPC}$ is the estimated flux for the portion of the scene, $T_{SPC}$ is exposure time, $\hat{N}^{SPC}_{T_{SPC}}$ is a photon count corresponding to the number of photon detections in exposure time $T_{SPC}$, $q_{SPAD}$ is a sensitivity of the detector, and $\tau_d$ is a dead time of the detector.

In accordance with some embodiments of the disclosed subject matter, a method for generating high dynamic range digital images is provided, the method comprising: receiving, from a first plurality of detectors, first image data comprising a first plurality of values each indicative of photon flux from a portion of a scene corresponding to a respective detector of the first plurality of detectors, wherein the first image data has a first resolution, each of the detectors of the first plurality of detectors is configured to detect a level of photons arriving at the detector that is proportional to an incident photon flux at the detector, and the first plurality of detectors are arranged in a first array; receive, from the second plurality of detectors, second image data comprising a second plurality of values each indicative of photon flux from a portion of the scene corresponding to a respective detector of the second plurality of detectors, wherein the second image data has a second resolution that is lower than the first resolution, each of the detectors of the second plurality of detectors is configured to configured to detect arrival of individual photons, and the second plurality of detectors are arranged in a second array; providing, as input to a first encoder of a trained machine learning model, a first plurality of flux values based on the second plurality of values, wherein the trained machine learning model comprises the first encoder, a second encoder, and a decoder; providing, as input to the second encoder of the trained machine learning model, a second plurality of flux values based on the first plurality of values; receiving, as output from the trained machine learning model, a third plurality of values each indicative of photon flux from a portion of the scene corresponding to a respective detector of the first plurality of detectors; and generating a high dynamic range image based on the third plurality of values.

In accordance with some embodiments of the disclosed subject matter, non-transitory computer readable medium containing computer executable instructions that, when executed by a processor, cause the processor to perform a method for generating high dynamic range digital images is provided, the method comprising: receiving, from a first plurality of detectors, first image data comprising a first plurality of values each indicative of photon flux from a portion of a scene corresponding to a respective detector of the first plurality of detectors, wherein the first image data has a first resolution, each of the detectors of the first plurality of detectors is configured to detect a level of photons arriving at the detector that is proportional to an incident photon flux at the detector, and the first plurality of detectors are arranged in a first array; receive, from the second plurality of detectors, second image data comprising a second plurality of values each indicative of photon flux from a portion of the scene corresponding to a respective detector of the second plurality of detectors, wherein the second image data has a second resolution that is lower than the first resolution, each of the detectors of the second plurality of detectors is configured to configured to detect arrival of individual photons, and the second plurality of detectors are arranged in a second array; providing, as input to a first encoder of a trained machine learning model, a first plurality of flux values based on the first plurality of values, wherein the trained machine learning model comprises the first encoder, a second encoder, and a decoder; providing, as input to the second encoder of the trained machine learning model, a second plurality of flux values based on the second plurality of values; receiving, as output from the trained machine learning model, a third plurality of values each indicative of photon flux from a portion of the scene corresponding to a respective detector of the first plurality of detectors; and generating a high dynamic range image based on the third plurality of values.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

DETAILED DESCRIPTION

Figure 1:
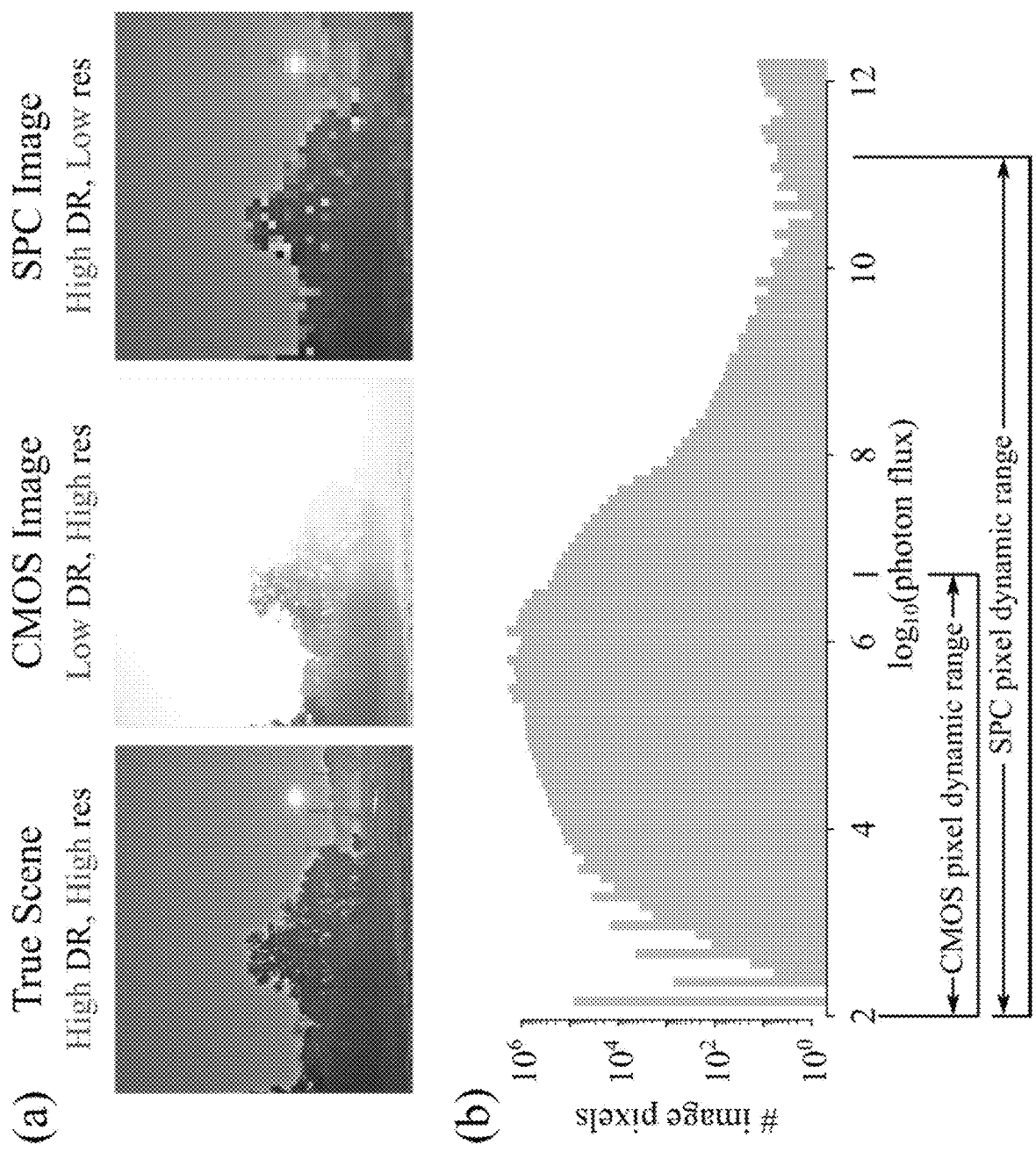
FIG. 1 shows an example of a high dynamic range scene, images of the scene generated using a complementary metal-oxide semiconductor (CMOS) image sensor and a single-photon image sensor, and a histogram showing the number of true scene pixels at various flux levels.

In accordance with various embodiments, mechanisms (which can, for example, include systems, methods, and media) for high dynamic range imaging using single-photon and conventional image sensor data are provided.

Recently, single-photon image sensors (e.g., based on single-photon avalanche diode (SPAD) detector technology), have become more popular for various image sensing applications. Such sensors can exhibit extreme sensitivity to light (e.g., down to individual photons) and high timing resolution, which can be used to achieve high dynamic range (e.g., extreme dynamic range where the brightest point in the image can be more than six orders of magnitude brighter than the dimmest point) from a single-shot. However, single-photon sensors have been limited to single-pixel detectors (e.g., which are swept across a scene) or very low-resolution SPAD arrays (e.g., 32×32 pixel arrays). While megapixel SPAD arrays are likely to be available relatively soon, the per-pixel bit-depth of these sensors is likely to be 1-bit. This can require thousands of binary frames to be read off the sensor to reconstruct a single image, which has relatively high power consumption, relatively long acquisition times, and are difficult to process in real time.

Emerging computer vision applications can benefit from imaging systems capable of capturing brightness levels with high dynamic range. For example, in a scene with very high (e.g., extreme) dynamic range, a brightest point in the image can be more than 6 orders of magnitude brighter than the dimmest point.

Some conventional high dynamic range imaging techniques capture multiple low dynamic range images of a scene with different exposure times, and merge the multiple images into a single high dynamic range image. For example, exposure bracketing, where a sequence of images with different exposure times are fused into a single high dynamic range (HDR) image, has been used to attempt to produce an image with increased dynamic range. However, this technique can lead to ghosting and light flicker artifacts, especially for dynamic scenes. To mitigate these artifacts, commercial HDR techniques are generally limited to fusing only 2-4 exposures acquired through sequential capture or with dual-pixel architectures. Recovering an extreme dynamic range image from only a few exposure stops often results in spatially non-uniform signal-to-noise-ratio (SNR) dip artifacts throughout the image. Large SNR dips can be a challenge because fine image features can be overwhelmed by noise, which can be difficult to denoise. Overall, spatially non-uniform SNR drops are a fundamental limitation of exposure bracketing in high dynamic range scenarios when only a small number of exposures can be captured. Although such techniques can produce acceptable images for static scenes, these techniques often suffer from "ghosting" artifacts when a scene includes motion. Spatially varying exposure image sensors can be used to attempt to mitigate such artifacts, but such image sensors introduce additional hardware complexity if more than two exposures are needed to cover the dynamic range. As described below, mechanisms described herein can use just two image sensors (e.g., a CMOS image sensor and a single-photon image sensor) can be used to generate extremely high dynamic range content (e.g., beyond the capability of conventional techniques, such as CMOS-CMOS fusion).

Another more recently developed technique attempts to generate a high dynamic range image using deep learning techniques to recover saturated regions from a single CMOS image. Such a technique performs quite well when the image contains a few overexposed regions. However, for scenes with extreme dynamic range where large regions of the scene are overexposed, such a deep learning approach can introduce significant artifacts, which are not appropriate in safety-critical applications. In some embodiments, mechanisms described herein can use relatively low resolution, and high dynamic range single-photon image sensor image data to facilitate reconstructing extremely bright and saturated regions that conventional single-image high dynamic range techniques struggle to recover.

Recently, event-based vision sensors have been used in conjunction with a CMOS image sensor for high dynamic range imaging. Unlike an event-camera that only captures changes in brightness, mechanisms described herein can utilize single-photon image sensor image data to directly capture scene intensity with extremely high dynamic range. Quanta image sensors (QIS) are also sensitive down to individual photons and can provide much higher dynamic range than conventional CMOS cameras. Nonetheless, due to the lack of precise timing information, the dynamic range achievable by the QIS is lower that what could be achieved with a SPAD-based SPC.

In general, the photon irradiance received at an image sensor pixel is proportional to the true brightness (radiance) of the scene point. If a fixed pixel size is assumed, the photon irradiance can be converted to total incident photon flux (e.g., in photons per second) which can be used as a proxy for scene brightness. Considering a fixed scene point with a brightness of $\Phi$ photons/second, the response curve of the image sensor pixel can determine a relationship between the incident photon flux and an output of the pixel. This response curve is an intrinsic property of the pixel and is quite different for a conventional CMOS image sensor pixel and a single-photon image sensor pixel.

A conventional CMOS camera pixel has a linear response curve where the photoelectric charge accumulated in the pixel is directly proportional to the incident photon flux $\Phi$. Camera manufacturers often apply a proprietary non-linear compression curve called the camera response function (CRF) to the raw pixel measurement. Assuming that access to the raw (linear) pixel values are accessible, the pixel output, $N_T^{CMOS}$, can be represented as a linear function of $\Phi$. For example, the average number of photoelectrons accumulated in a CMOS pixel over exposure time, T, can be represented using the following relationship:

$$E[N_T^{CMOS}] = q_{CMOS} \Phi T \qquad (1)$$

and has a variance due to Poisson noise can be represented using the following relationship:

$$\text{Var}[N_T^{CMOS}] = q^2_{CMOS} \Phi^2 T^2 \qquad (2)$$

where $0 < q_{CMOS} < 1$ is the pixel sensitivity. Note that if raw linear pixel values are not available, the CRF can be estimated to linearize the values output by the image sensor. Recent advances in CMOS pixel technology have led to a reduction in electronic read noise sources, approaching or achieving sub-electron levels in normal illumination conditions. Electronic read noise in such pixels is negligible in a high-flux regime considered herein, and can be ignored. In some embodiments, a Gaussian approximation can be used, and it can be assumed that each CMOS pixel generates an output $\hat{N}^{CMOS}_T$ that follows a normal distribution with mean and variance represented by EQS. (1) and (2), and rounded to the nearest integer. Additionally, a full well capacity can be enforced, such that $\hat{N}^{CMOS}_T$ can be clamped at a maximum of $N_{FWC}$.

In some embodiments, the incident per-pixel photon flux received at a CMOS pixel can be estimated using the following relationship:

$$\hat{\Phi}^{CMOS} = \frac{\hat{N}_T^{CMOS}}{q_{CMOS} T} \qquad (3)$$

if the pixel is not saturated (e.g., the pixel output $\hat{N}^{CMOS}_T$ is less than $N_{FWC}$).

In some embodiments, a single-photon pixel (e.g., implemented using a single-photon avalanche diode (SPAD), implemented using jots of a QIS, or) can be operated in a passive free-running configuration. For example, in such a single-photon pixel, after each photon detection event, a single-photon sensor enters a dead-time during which the sensor cannot detect any photons. In such a free-running configuration when the photon flux is higher, the fraction of photons missed due to the dead-time can be expected to be higher. This results in a non-linear response curve where the average number of photons ($N_T^{SPC}$) captured by the pixel over a fixed exposure time (T) can be represented using the following relationship:

$$E[N_T^{SPC}] = \frac{q_{SPAD} \Phi T}{1 + q_{SPAD} \Phi \tau_d} \qquad (4)$$

where $0 < q_{SPAD} < 1$ is the pixel sensitivity, and $\tau_{z,?}$ is the dead-time. Due to the inherent uncertainty from the Poisson nature of light, the number of photons can be expected to fluctuate and the variance of such fluctuation can be represented using the following relationship:

$$\text{Var}\left[N_T^{SPC}\right] = \frac{q_{SPAD}\Phi T}{(1+q_{SPAD}\Phi\tau_d)^3} \quad (5)$$

In some embodiments, a Gaussian approximation can be used, and it can be assumed that each single-photon pixel generates normally distributed photon counts with a mean and variance represented by EQS. (4) and (5) and rounded to the closest integer. From the measured photon counts, $\hat{N}_T^{SPC}$, the per-pixel photon flux can be estimated using the inverse of EQ. (4), which can be represented as:

$$\hat{\Phi}^{SPC} = \frac{\hat{N}_T^{SPC}/q_{SPAD}}{T-\tau_d\hat{N}_T^{SPC}} \quad (6)$$

In some embodiments, mechanisms described herein can estimate the flux at each single-photon sensor, for example, using EQ. (6).

In some embodiments, the per-pixel photon flux can be estimated based on the arrival time of photons in addition to, or in lieu of, a count of the number of photon arrivals. For example, as described in U.S. Pat. No. 10,616,512, per-pixel photon flux can be calculated based on the mean time between photon detections. For example, per-pixel photon flux can be estimated using the following relationship:

$$\hat{\Phi}^{SPC} = \frac{1}{q}\left(\frac{1}{\overline{X}-\tau_d}\right).$$

(6')
where $$\overline{X} = \frac{1}{N(T)-1}\sum_{i=1}^{N(T)-1} X_i$$

is the mean time between detections and $0<q<1$ is the photon detection probability of the SPAD pixel (sometimes referred to as the quantum efficiency of the SPAD pixel), and $X_i$ is the time between a pair of successive detections (e.g., $X_1$ is the time between the first and second detections, $X_2$ is the time between the second and third detections, etc., and $X_{N(T)-1}$ is the time between the penultimate and last detections within exposure time T).

FIG. 1 shows an example of a high dynamic range scene, images of the scene generated using a complementary metal-oxide semiconductor (CMOS) image sensor and a single-photon image sensor, and a histogram showing the number of true scene pixels at various flux levels.

In some embodiments, mechanisms described herein can utilize learning-based sensor fusion techniques that utilize high-resolution, low dynamic range (LDR) information (e.g., captured using conventional CMOS pixels) and low-resolution, extremely high dynamic range image information captured by a single-photon pixels to reconstruct a high spatial resolution and extreme dynamic range image. FIG. 1, panel (a) shows examples of a high dynamic range scene, the scene as captured using a conventional CMOS image sensor, and the scene captured using a single-photon-based image sensor (labeled SPC). In some embodiments, mechanisms described herein fusing a single SPC image and a single CMOS image can outperform dual-exposure bracketing fusion techniques that rely on two images, especially in situations where the dynamic range is too large to be covered by two CMOS exposures, for example, as shown in FIG. 1, panel (b).

Figure 2:
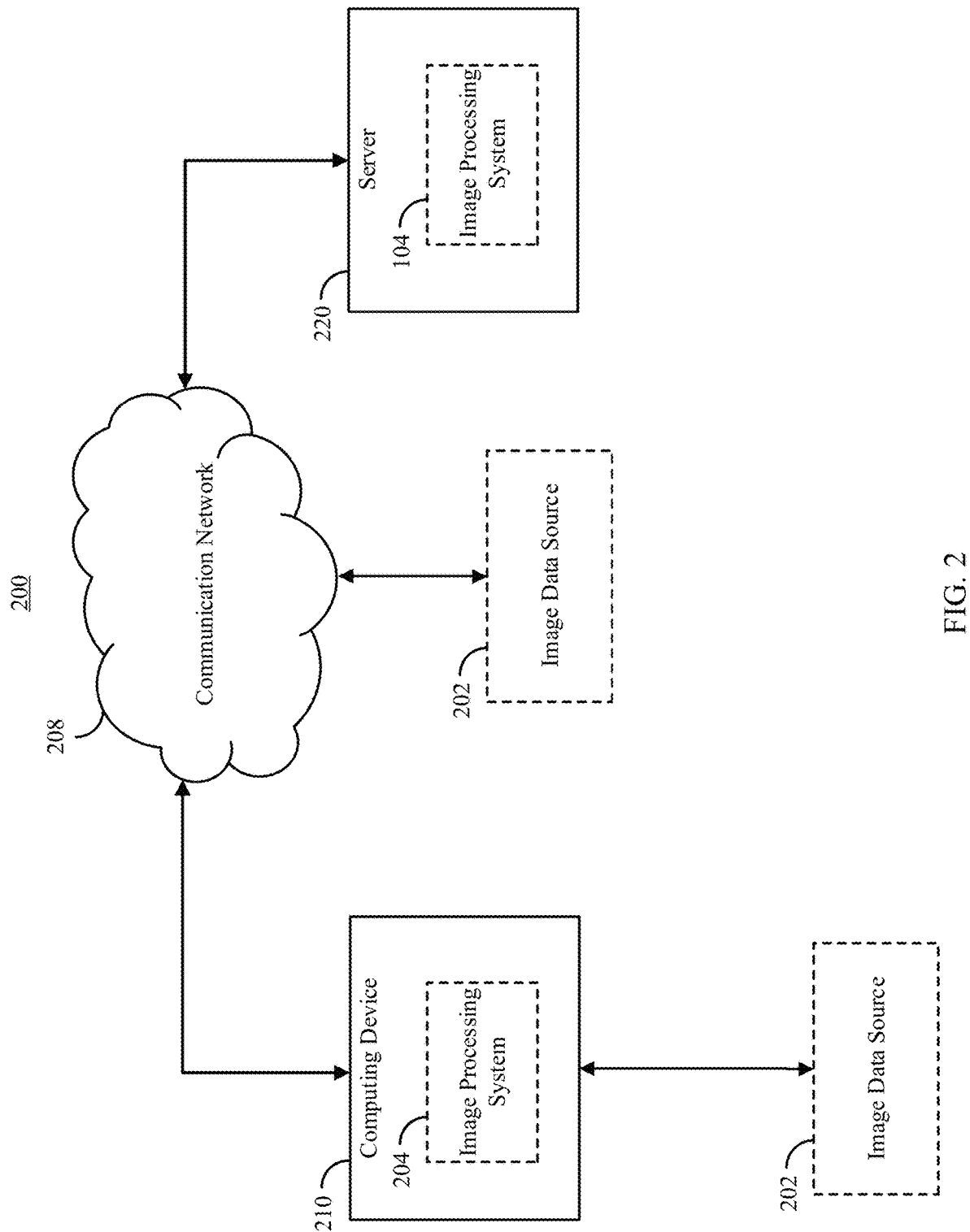
FIG. 2 shows an example of a system for high dynamic range imaging using single-photon and conventional image sensor data in accordance with some embodiments of the disclosed subject matter.

FIG. 2 shows an example 200 of a system for high dynamic range imaging using single-photon and conventional image sensor data in accordance with some embodiments of the disclosed subject matter. As shown in FIG. 2, a computing device 210 can receive image data from an image data source(s) 202. In some embodiments, computing device 210 can execute at least a portion of an image processing system 204 to perform an image processing task, such as generating a high dynamic range image using a neural network, training a neural network to generate high dynamic range images, etc. Additionally, in some embodiments, computing device 210 can execute at least a portion of a machine vision system (not shown) to perform a machine vision task, such as image classification, object detection, image segmentation, object tracking, and/or any other suitable computer vision task. For example, a machine vision system can receive one or more images (e.g., a high dynamic range image, etc.) generated by image processing system 204, and can perform a machine vision tasks based on the image(s) received from image processing system 204.

Additionally or alternatively, in some embodiments, computing device 210 can communicate data received from image data source 202 to a server 220 over a communication network 208, which can execute at least a portion of image processing system 204 and/or at least a portion of a machine vision system. In such embodiments, server 220 can return information to computing device 210 (and/or any other suitable computing device) indicative of an output of an image processing task performed by image processing system 204 and/or a computer vision system. In some embodiments, image processing system 204 can execute one or more portions of process 600 described below in connection with FIG. 6.

In some embodiments, computing device 210 and/or server 220 can be any suitable computing device or combination of devices, such as a desktop computer, a laptop computer, a smartphone, a tablet computer, a wearable computer, a server computer, a computing device integrated into a vehicle (e.g., an autonomous vehicle), a camera, a robot, a virtual machine being executed by a physical computing device, etc.

In some embodiments, image data source 202 can be any suitable source of image data (e.g., implemented with combination of at least conventional pixels and single-photon pixels) and/or other data that can be used to generate high dynamic range images as described herein (e.g., depicting a scene in a physical environment of image data source 202). For example, image data source 202 can be implemented using one or more digital cameras that generate and/or output image data indicative of an arrival time of single photons. In a more particular example, image data source 202 can include an imaging device configured to detect arrival of individual photons (e.g., using avalanche photodiodes), such as imaging devices described in U.S. patent application Ser. No. 16/844,899, filed Apr. 9, 2020, and titled "Systems, methods, and media for high dynamic range quanta burst imaging." As another more particular example, image data source 202 can include an imaging device configured to detect arrival of individual photons (e.g., using jot-based detectors), such as imaging devices described in Fossum et al., "The quanta image sensor: Every photon Counts," Sensors, (2016).

In some embodiments, image data source 202 can be local to computing device 210. For example, image data source 202 can be incorporated with computing device 210 (e.g., computing device 210 can be configured as part of a device for capturing, storing, and/or processing image data). As another example, image data source 202 can be connected to computing device 210 by a cable, a direct wireless link, etc. Additionally or alternatively, in some embodiments, image data source 202 can be located locally and/or remotely from computing device 210, and can communicate image data (e.g., CMOS image data, single-photon sensor image data, etc.) to computing device 210 (and/or server 220) via a communication network (e.g., communication network 208).

In some embodiments, communication network 208 can be any suitable communication network or combination of communication networks. For example, communication network 208 can include a Wi-Fi network (which can include one or more wireless routers, one or more switches, etc.), a peer-to-peer network (e.g., a Bluetooth network), a cellular network (e.g., a 3G network, a 4G network, a 5G network, etc., complying with any suitable standard, such as CDMA, GSM, LTE, LTE Advanced, NR, etc.), a wired network, etc. In some embodiments, communication network 208 can be a local area network, a wide area network, a public network (e.g., the Internet), a private or semi-private network (e.g., a corporate or university intranet), any other suitable type of network, or any suitable combination of networks. Communications links shown in FIG. 2 can each be any suitable communications link or combination of communications links, such as wired links, fiber optic links, Wi-Fi links, Bluetooth links, cellular links, etc.

Figure 3:
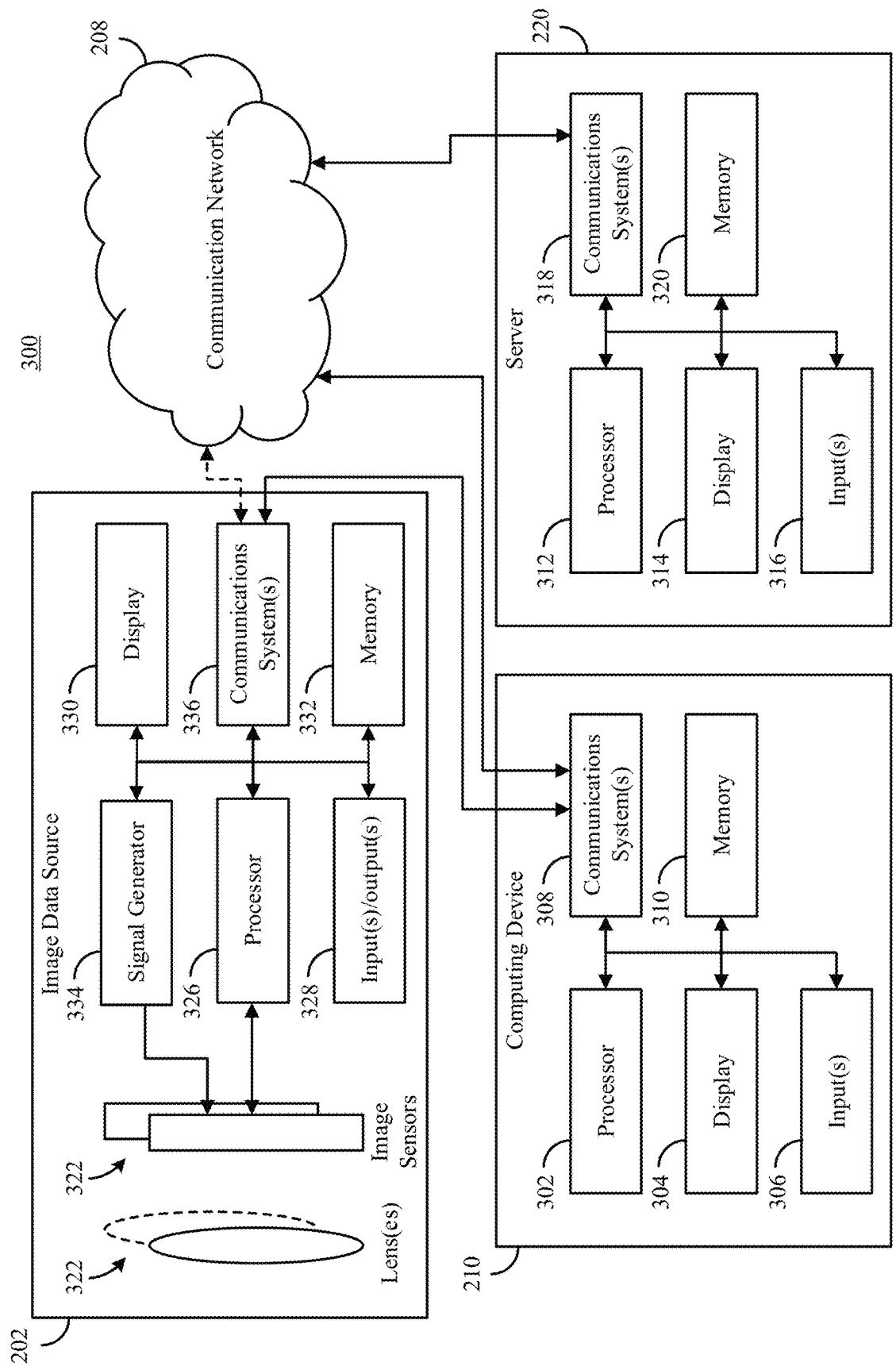
FIG. 3 shows an example of hardware that can be used to implement an image data source, a computing device, and a server, shown in FIG. 2 in accordance with some embodiments of the disclosed subject matter.

FIG. 3 shows an example of hardware that can be used to implement image data source 202, computing device 210, and/or server 220, shown in FIG. 2 in accordance with some embodiments of the disclosed subject matter. As shown in FIG. 3, in some embodiments, computing device 210 can include a processor 302, a display 304, one or more inputs 306, one or more communication systems 308, and/or memory 310. In some embodiments, processor 302 can be any suitable hardware processor or combination of processors, such as a central processing unit (CPU), a graphics processing unit (GPU), an application specific integrated circuit (ASIC), a field-programmable gate array (FPGA), etc. In some embodiments, display 304 can include any suitable display devices, such as a computer monitor, a touchscreen, a television, an infotainment screen, etc. In some embodiments, inputs 306 can include any suitable input devices and/or sensors that can be used to receive user input, such as a keyboard, a mouse, a touchscreen, a microphone, etc.

In some embodiments, communications systems 308 can include any suitable hardware, firmware, and/or software for communicating information over communication network 208 and/or any other suitable communication networks. For example, communications systems 308 can include one or more transceivers, one or more communication chips and/or chip sets, etc. In a more particular example, communications systems 308 can include hardware, firmware and/or software that can be used to establish a Wi-Fi connection, a Bluetooth connection, a cellular connection, an Ethernet connection, etc.

In some embodiments, memory 310 can include any suitable storage device or devices that can be used to store image data, instructions, values, etc., that can be used, for example, by processor 302 to perform an image processing task, to present content using display 304, to communicate with server 220 via communications system(s) 208, etc. Memory 310 can include any suitable volatile memory, non-volatile memory, storage, or any suitable combination thereof. For example, memory 310 can include random access memory (RAM), read-only memory (ROM), electronically-erasable programmable read-only memory (EEPROM), one or more flash drives, one or more hard disks, one or more solid state drives, one or more optical drives, etc. In some embodiments, memory 310 can have encoded thereon a computer program for controlling operation of computing device 210. For example, in such embodiments, processor 302 can execute at least a portion of the computer program to perform one or more image processing tasks described herein and/or to perform one or more machine vision tasks based on an output generated by an image processing task described herein, present content (e.g., images, information about an object included in image data, information about distances to one or more points in a scene, etc.), receive information and/or content from image data source 202, transmit information to image data source 202, receive information and/or content from server 220, transmit information to server 220, etc. As another example, processor 302 can execute at least a portion of the computer program to implement image processing system 204 and/or a machine vision system. As yet another example, processor 302 can execute at least a portion of process 600 described below in connection with FIG. 6.

In some embodiments, server 220 can include a processor 312, a display 314, one or more inputs 316, one or more communications systems 318, and/or memory 320. In some embodiments, processor 312 can be any suitable hardware processor or combination of processors, such as a CPU, a GPU, an ASIC, an FPGA, etc. In some embodiments, display 414 can include any suitable display devices, such as a computer monitor, a touchscreen, a television, etc. In some embodiments, inputs 316 can include any suitable input devices and/or sensors that can be used to receive user input, such as a keyboard, a mouse, a touchscreen, a microphone, etc.

In some embodiments, communications systems 318 can include any suitable hardware, firmware, and/or software for communicating information over communication network 208 and/or any other suitable communication networks. For example, communications systems 318 can include one or more transceivers, one or more communication chips and/or chip sets, etc. In a more particular example, communications systems 318 can include hardware, firmware and/or software that can be used to establish a Wi-Fi connection, a Bluetooth connection, a cellular connection, an Ethernet connection, etc.

In some embodiments, memory 320 can include any suitable storage device or devices that can be used to store instructions, values, etc., that can be used, for example, by processor 312 to present content using display 314, to communicate with one or more computing devices 210, to communicate with one or more image data sources 202, etc. Memory 320 can include any suitable volatile memory, non-volatile memory, storage, or any suitable combination thereof. For example, memory 320 can include RAM, ROM, EEPROM, one or more flash drives, one or more hard disks, one or more solid state drives, one or more optical drives, etc. In some embodiments, memory 320 can have encoded thereon a server program for controlling operation of server 220. For example, in such embodiments, processor 312 can execute at least a portion of the server program to perform one or more image processing tasks described herein and/or to perform one or more machine vision tasks based on an output generate by an image processing task described herein, present content (e.g., images, information about an object included in image data, information about distances to one or more points in a scene, etc.), receive information and/or content from image data source 202, transmit information to image data source 202, receive information and/or content from computing device 210, transmit information to computing device 210, etc. As another example, processor 312 can execute at least a portion of the server program to implement image processing system 204 and/or a machine vision system. As yet another example, processor 312 can execute at least a portion of process 600 described below in connection with FIG. 6.

As shown, image data source 202 can include image sensors 322 (e.g., a conventional area sensor that includes an array of conventional pixels, such as a CMOS sensor or a CCD sensor; and an area sensor that includes an array of single photon detectors, such as a SPAD array or array of jots, e.g., as described in U.S. patent application Ser. No. 16/844,899); optics 322 (which can include, for example, one or more lenses, one or more attenuation elements such as a filter, a diaphragm, and/or any other suitable optical elements such as a beam splitter, etc.); a processor 326 for controlling operations of image data source 202 which can include any suitable hardware processor (which can be a central processing unit (CPU), a digital signal processor (DSP), a microcontroller (MCU), a graphics processing unit (GPU), etc.) or combination of hardware processors; an input device(s) 328 (such as a shutter button, a menu button, a microphone, a touchscreen, a motion sensor, etc., or any suitable combination thereof) for accepting input from a user and/or from the environment; a display 330 (e.g., a touchscreen, a liquid crystal display, a light emitting diode display, etc.) to present information (e.g., images, user interfaces, etc.) for consumption by a user; memory 332; a signal generator 334 for generating one or more signals to control operation of image sensors 322; a communication system or systems 336 for facilitating communication between image data source 202 and other devices, such as a smartphone, a wearable computer, a tablet computer, a laptop computer, a personal computer, a server, an embedded computer (e.g., for controlling an autonomous vehicle, robot, etc.), etc., via a communication link. In some embodiments, memory 332 can store image data, and/or any other suitable data. Memory 332 can include a storage device (e.g., RAM, ROM, EEPROM, one or more flash drives, one or more hard disks, one or more solid state drives, one or more optical drives, etc.) for storing a computer program for controlling processor 326. In some embodiments, memory 332 can include instructions for causing processor 326 to execute processes associated with the mechanisms described herein, such as process 600 described below in connection with FIG. 6.

In some embodiments, image sensors 322 can be include an image sensor that is implemented at least in part using an array of SPAD detectors (sometimes referred to as a Geiger-mode avalanche diode) and/or one or more other detectors that are configured to detect the arrival time of individual photons (e.g., jots). In some embodiments, one or more elements of a single photon image sensor 322 can be configured to generate data indicative of the arrival time of photons from the scene via optics 324. For example, in some embodiments, image sensor 322 can be an array of multiple SPAD detectors. As yet another example, image sensor 322 can be a hybrid array including SPAD detectors and one or more conventional light detectors (e.g., CMOS-based pixels). As still another example, image sensor 322 can include multiple image sensors, such as a first image sensor that includes an array of SPAD detectors that can be used to generate at least information about the brightness of the scene and a second image sensor that includes one or more conventional pixels that can be used to generate higher resolution information about the colors and/or brightness in the scene. In such an example, optics 322 can include one or more optical elements (e.g., multiple lenses, a beam splitter, etc.) configured to direct a portion of incoming light toward a SPAD-based image sensor and another portion toward a conventional image sensor. In a more particular example, image sensors 322 can include a CMOS sensor, a CCD sensor, an array of single-photon avalanche diodes (SPADs), an array of jots, etc. In some embodiments, image sensors 322 can be co-located with respect to a scene to be imaged. For example, optics (e.g., a beam splitter) can be disposed between a lens and sensors 322, such that a conventional image sensor (e.g., a CMOS sensor, a CCS sensor, etc.) and a single-photon sensor (e.g., a SPAD sensor) are exposed to the same image of the scene. As another example, for scenes that are sufficiently distant from image data source 202, image sensors 324 can be associated with different lenses (e.g., having different optical axes), and can be spaced to sufficiently reduce parallax between the image sensors, such that the image sensors are effectively co-located.

In some embodiments, image data source 202 can include additional optics. For example, although optics 324 is shown as a single lens or multiple parallel lenses, optics 324 can be implemented as compound lenses or combinations of lenses. Note that although mechanisms described herein are generally described as using SPAD-based detectors and CMOS-based pixels, this is merely an example of a single photon detector and a conventional pixel. As described above, other single photon detectors can be used, such as jot-based image sensors, and other conventional pixels can be used, such as CCD pixels.

In some embodiments, signal generator 334 can be one or more signal generators that can generate signals to control image sensors 322. For example, in some embodiments, signal generator 334 can supply signals to enable and/or disable one or more pixels of image sensor 322 (e.g., by controlling a gating signal of a SPAD used to implement the pixel, by controlling signals applied to CMOS pixels). As another example, signal generator 334 can supply signals to control readout of image signals from image sensor 322 (e.g., to memory 332, to processor 326, to a cache memory associated with image sensor 322, etc.).

In some embodiments, image data source 202 can communicate with a remote device over a network using communication system(s) 336 and a communication link. Additionally or alternatively, image data source 202 can be incorporated as part of another device and/or integrated as part of another device (e.g., computing device 210), such as a smartphone, a tablet computer, a laptop computer, an autonomous vehicle, a robot, etc. Parts of image data source 202 can be shared with a device within which image data source 202 is integrated. For example, if image data source 202 is integrated with an autonomous vehicle, processor 326 can be a processor of the autonomous vehicle and can be used to control operation of image data source 202.

In some embodiments, display 330 can be used to present images and/or video generated by image data source 202 and/or by another device (e.g., computing device 210, server 220, etc.), to present a user interface, etc. In some embodiments, display 330 can be implemented using any suitable device or combination of devices, and can include one or more inputs, such as a touchscreen.

Figure 4:
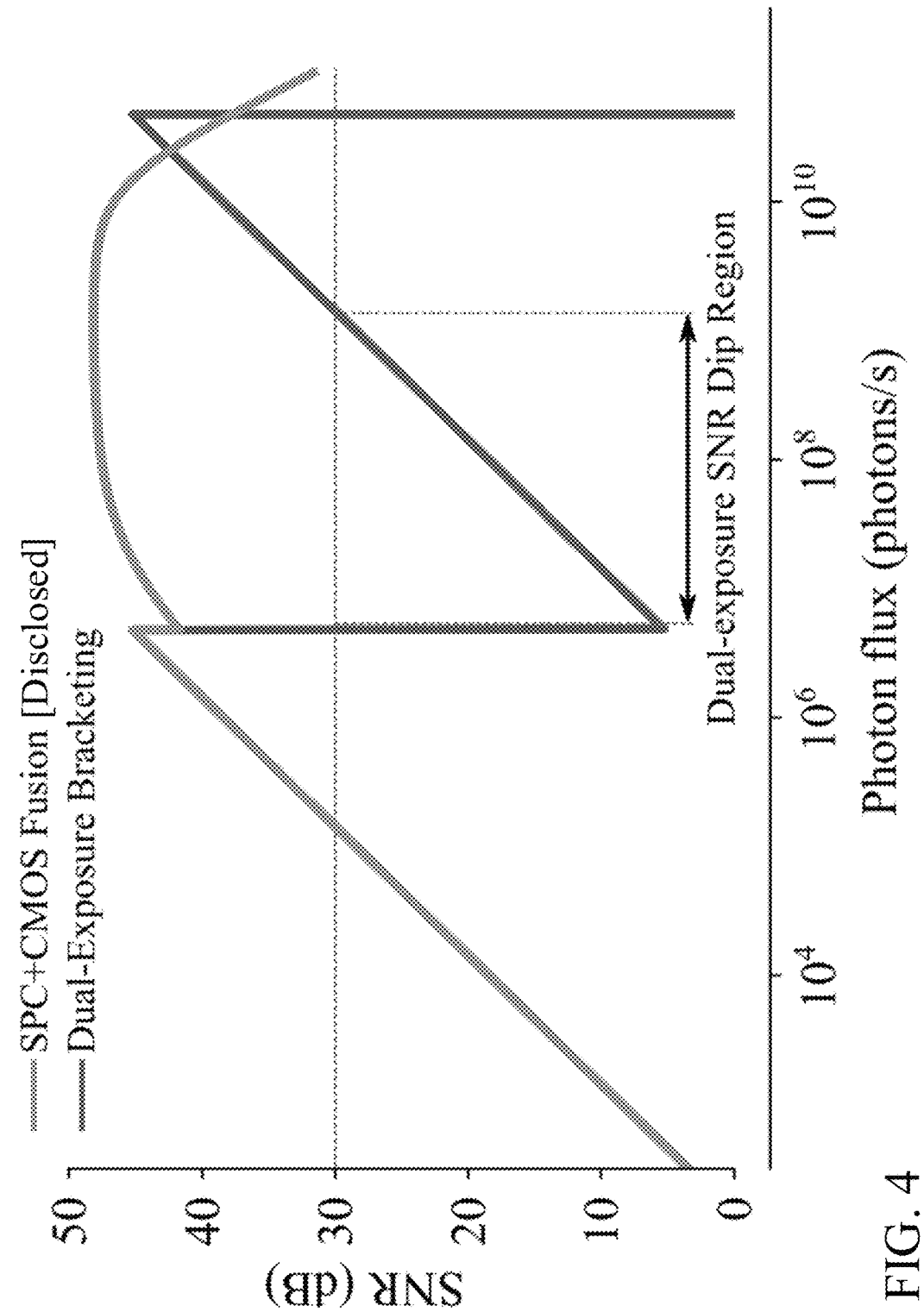
FIG. 4 shows an example illustrating a comparison of theoretical signal-to-noise ratios (SNRs) across various flux levels for mechanisms described herein and another technique.

FIG. 4 shows an example illustrating a comparison of theoretical signal-to-noise ratios (SNRs) across various flux levels for mechanisms described herein and another technique. As described above, the dynamic range of image sensor implemented using single-photon detectors (sometimes referred to as single photon cameras (SPC)) is sufficient for many applications. Similarly, the spatial resolution of conventional image sensors (e.g., CMOS sensors) is also sufficient for many applications. In some embodiments, mechanisms described herein can utilize the relatively large dynamic that can be generated by single-photon detectors with relatively high spatial resolution of conventional image sensors to generate relatively high resolution images with higher dynamic range. For example, utilizing information both types of sensors can mitigate dip artifacts that may be caused by exposure bracketing, as single-photon detectors (e.g., SPADs) can sustain high signal-to-noise ratio (SNR) at extreme brightness levels by using sufficiently long (but practical) exposure times. As shown in FIG. 4, the SNR of a conventional CMOS sensor may be limited outside of a narrow range of brightness levels. Utilizing a dual-exposure bracketing technique (e.g., capturing a first image with a short exposure time to attempt to properly expose bright regions, and a second image with a longer exposure time to attempt to properly expose dark regions) can expand the dynamic range of the image. However, there is a pronounced reduction in SNR for intermediate brightness regions. In some embodiments, mechanisms described herein can generate images with a photon flux versus SNR curve with a smaller dip, as the greater dynamic range of the SPC can increase the SNR in bright regions (e.g., with a single exposure for each image sensor), where $$SNR := 20 \log_{10}\left(\Phi / \sqrt{E\left[(\hat{\Phi} - \Phi)^2\right]}\right).$$

Figure 5:
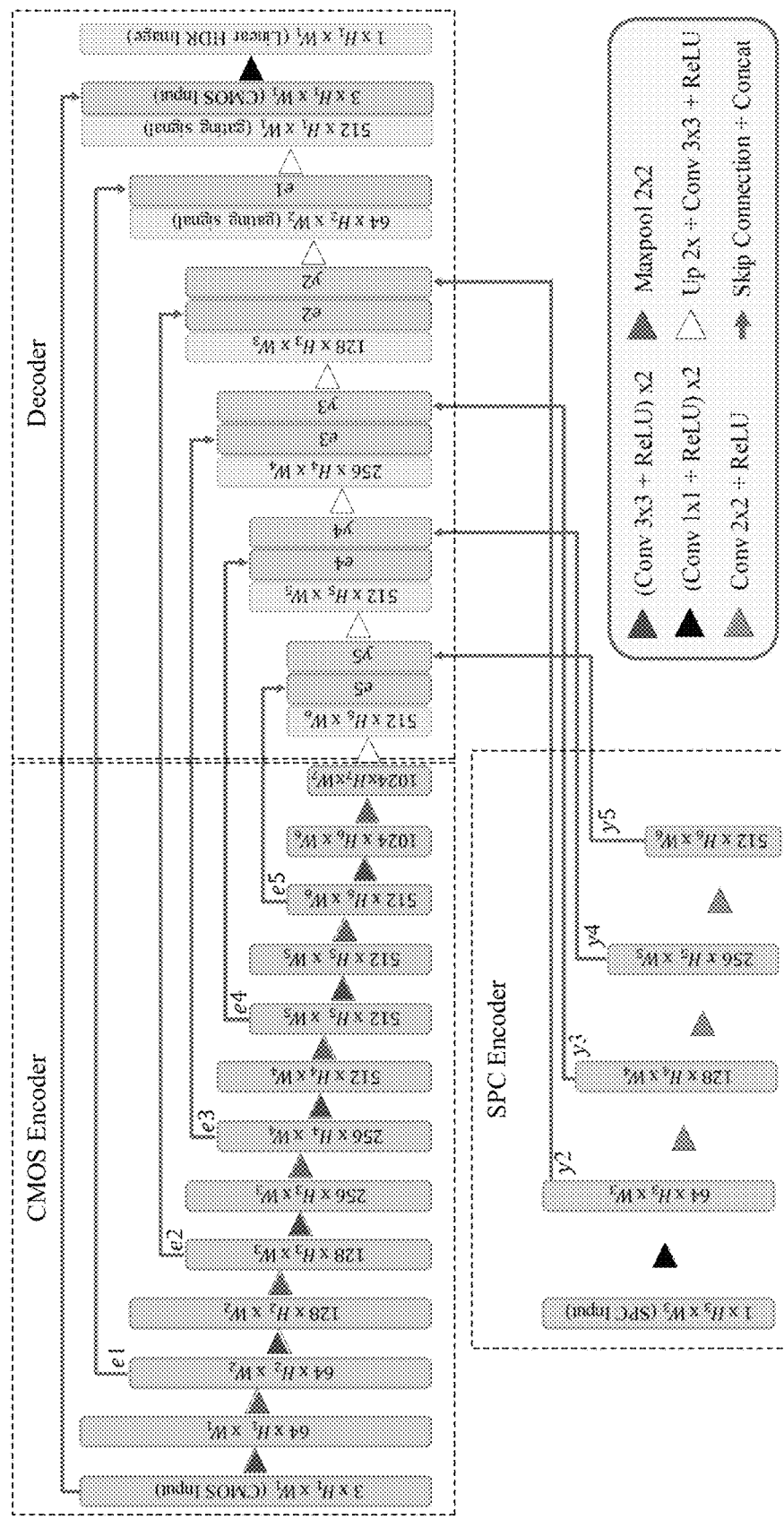
FIG. 5 shows an example of a topology of a convolutional neural network that can be used to implement mechanisms for high dynamic range imaging using single-photon and conventional image sensor data in accordance with some embodiments of the disclosed subject matter.

FIG. 5 shows an example of a topology of a convolutional neural network that can be used to implement mechanisms for high dynamic range imaging using single-photon and conventional image sensor data in accordance with some embodiments of the disclosed subject matter. As shown in FIG. 5, mechanisms described herein can use a U-net-based network architecture. Additionally, in some embodiments, a network used in connection with mechanisms described herein can include multiple encoders. For example, the network can include a CMOS encoder that extracts features from CMOS images. As another example, the network can include a SPC encoder that extracts features from SPC images. In some embodiments, inputs to each encoder can be estimated linear photon flux images output by and/or generated from the output of, the CMOS and SPC image sensors, respectively. Note that in the topology shown in FIG. 5, the CMOS image data has a resolution of 4× the resolution of the SPC images. However, this is merely an example, and the ratio of resolutions can be larger or smaller. For example, a neural network with a ratio of 8× or 16× can be implemented by including additional layers in the encoders and in the decoder.

In some embodiments, the encoders can sequentially filter and downsample by 2× the input conventional and single-photon image data to extract multi-scale features. For example, as shown in FIG. 5, the conventional image data can be characterized as having $H_1 \times W_1$ pixels, where $H_1$ can be a number of pixels in a particular direction (e.g., in a height direction) and $W_1$ can be a number of pixels in another direction (e.g., in a width direction). In such an example, the CMOS encoder can filter the input data (e.g., using a 3×3 convolution layer, a ReLU layer, a second a 3×3 convolution layer, and a second ReLU layer), and can downsample the filtered data (e.g., using a 2×2 maxpool layer), reducing the size of the representation to $$H2 = \frac{H1}{2}$$

and $$W2 = \frac{W1}{2}.$$

The CMOS encoder can perform similar operations using the downsampled data, further reducing the size of the representation to $$H3 = \frac{H1}{4} \text{ and } W3 = \frac{W1}{4},$$

and so on. In some embodiments, the decoder can further filter the representation, and can up-sample the feature maps. The last layer can execute a blending operation of the input CMOS image and the learned up-sampling of the SPC image.

As shown in FIG. 5, in some embodiments, output tensors in the decoder (e.g., the first box after each arrow in the decoder) can be concatenated with an element from the CMOS encoder and, in some layers, an element from the SPC encoder. For example, a 512×$H_6$×$W_6$ tensor can be generated by up-sampling the final 512×$H_7$×$W_7$ by a factor of 2, using a 3×3 convolution layer, and a ReLU layer. The 512×$H_6$×$W_6$ tensor can be concatenated with (e5) and (y5), and the result of the concatenation can be used to generate a 512×$H_5$×$W_5$ tensor, which can then be concatenated with (e4) and (y4), and so on.

In some embodiments, mechanisms described herein can use any suitable technique of combination of techniques to determine the estimated linear flux for various portions of an image. For example, mechanisms described herein can utilize EQ. (3) to estimate flux based on an output of a CMOS sensor. As another example, mechanisms described herein can utilize EQ. (6) to estimate flux based on an output of a SPC sensor.

In some embodiments, a neural network implemented in accordance with mechanisms described herein can be trained using a loss function that includes a term based on the difference between the labeled (e.g., true) flux associated with a particular portion of a training image, and the flux estimated by the neural network. Additionally, in some embodiments, the loss can include a term based on the difference between the content of the training image and the content of the image estimated by the neural network, which is sometimes referred to herein as the perceptual loss.

In some embodiments, a neural network with parameters θ implemented in accordance with some embodiments of the disclosed subject matter can reconstruct flux values $\hat{\Phi}^{Fused}$ of a linear photon flux HDR image:

$$\hat{\Phi}^{Fused} = F_\theta(\hat{\Phi}^{CMOS}, \hat{\Phi}^{SPC}) \tag{7}$$

Computing a loss directly on the linear high dynamic range pixel values generated by the neural network can result in the loss function being dominated by the larger pixel values. In some embodiments, the loss function can be calculated on tone-mapped domain, rather than using linear values output by the neural network. For example, mechanisms described herein can use µ-compression as a differentiable tone-mapping operator using the following relationship:

$$\hat{\Phi}_\mu^{Fused} = \frac{\log\left(1 + \mu \hat{\Phi}^{Fused}\right)}{\log(1 + \mu)} \quad (8)$$

Note that for all the models for which results are presented herein, a value µ=2000 was used.

In some embodiments, mechanisms described herein can use a loss function that includes a pixel-wise loss and a perceptual loss. In some embodiments, the pixel-wise loss can be calculated as the l1 distance of the tone-mapped output and target using the following relationship:

$$L^{l1} = \|\Phi_\mu - \hat{\Phi}_\mu^{Fused}\| \quad (9)$$

Where Φ is the true photon flux image. In some embodiments, the perceptual loss can be calculated using outputs of a pre-trained VGG-19 model, and using the following relationship:

$$L_{vgg} = \sum_{i=1}^{N}\left(\left\|g_i(\Phi_u) - g_i\left(\hat{\Phi}_\mu^{Fused}\right)\right\|_2^2\right) \quad (10)$$

where $g_i(\cdot)$ are the ith layer activations of the VGG model. Using EQS. (9) and (10), in some embodiments, the loss function can be represented using the following relationship:

$$L = L_{l1} + \alpha L_{vgg} \quad (11)$$

where α=0.1.

In some embodiments, mechanisms described herein can use any suitable training data to train the neural network. For example, in some embodiments, images with known flux values can be used to generate simulated CMOS and SPC images for use in training. As another example, image data source 202 can be used to capture images of scenes for which flux can be determined (e.g., using a second co-located imaging device configured to determine the true flux in the scene). As yet another example, separate CMOS and SPC imaging devices (e.g., that are co-located) can be used to capture images of a scene for which brightness can be determined.

In general, as single-photon sensors are an emerging technology, there are no real-world datasets available. In some embodiments, a simulation pipeline that leverages existing HDR image datasets can be used to generate a large-scale paired CMOS-SPC image dataset. Additionally, current commercially available SPC sensors are monochrome, and results described below are restricted to monochrome images. However, this is merely an example, and mechanisms described herein can be used with color image data.

In some embodiments, mechanisms described herein can simulate CMOS images and SPC images from an input ground truth photon flux images, Φ. In some embodiments, mechanisms described herein can simulate a CMOS image using Φ and a Gaussian approximation described above in connection with EQS. (1)-(3) with the pixel sensitivity and exposure parameters set to $q_{CMOS}$=0.75 and T=0.01 s. This can be followed by the sensor saturation with $N_{FWC}$=33400. Simulated CMOS images can include linear digitized pixel intensities (e.g., $\hat{N}_T^{CMOS}$), which is approximately a 15-bit image.

In some embodiments, mechanisms described herein can simulate a CMOS image using by downsampling the Φ image (e.g., by 4×, 8×, etc.) using OpenCV's cv2.INTER_AREA interpolation. The SPC image can be simulated from Φ using the Gaussian approximation described above in connection with EQS. a(4)-(6) with pixel sensitivity, exposure time, and dead time parameters set to q=0.25, T=0.01 s, and $\tau_d$ =150 ns, respectively. In some embodiments, the simulated SPC image can represent the photon counts measured by each pixel (e.g., $\hat{N}_T^{SPC}$).

In results described below, a dataset of 667 high-resolution HDR images were used to generate a set of training images (e.g., 469 images with 4096×2048 resolution from Poly Haven, which were available at https(colon)//polyhaven(dot)com; 93 images with 2048×1024 resolution from the Laval Indoor HDR dataset, which were described in Gardner et al., "Learning to predict indoor illumination from a single image," arXiv preprint arXiv:1704.00090 (2017) and are available at http(colon)//indoor(dot)hdrdb(dot)com; and 105 images with 2142×1422 resolution which were used in Funt et al., "The effect of exposure on maxrgb color constancy," in Human Vision and Electronic Imaging (2010), and Funt et al., "The rehabilitation of maxrgb," in Color and Imaging Conference (2010)). For each dataset, the distribution of its irradiance values was analyzed to determine an appropriate scaling factor that would make the distribution span a wide range of realistic photon flux values (details are described in Appendix A, which is hereby incorporated by reference herein in its entirety). For models that use monochrome inputs, the R/B channels were excluded.

Figure 11:
FIG. 11 shows examples of images generated using mechanisms described herein and various other techniques and images generated using various other techniques.

Additionally, as described below, an experimental CMOS-SPC system was implemented and used to generate image pairs. However, the images were not aligned due to a relatively large physical distance between the sensors in the experimental system, and each sensor was subject particular optical parameters (e.g., different focal length and aberrations). To mitigate the differences, small overlapping crops were manually selected from each image and registered by estimating an affine transformation using MATLAB's imregtform function. The approximately aligned crops shown in the first and second rows of FIG. 11 are 84×73 and 71×71, respectively. Additionally, the CMOS and SPC crops were bilinearly re-sampled such that the dimensions were 256×256 and 64×64.

In some embodiments, the photon flux can be estimated from pixel intensities in the training images (e.g., using EQS. (3) and (6)) to generate CMOS and SPC images that have similar distributions in non-saturated regions. The CMOS ($\hat{\Phi}^{CMOS}$), SPC($\hat{\Phi}^{SPC}$), and ground truth (Φ) images can be normalized by dividing by the CMOS photon flux saturation limit (e.g., $$\frac{N_{FWC}}{T}\bigg),$$

and multiplying by 255.

In some embodiments, mechanisms described herein can, during each training step, randomly select patches from the CMOS and SPC images of size 512×256 and 128×64, respectively. For example, to promote a balanced dataset that contains sufficient examples of saturated CMOS image regions, when selecting a random patch, mechanisms described herein can sample 10 patches and select a patch where at least 10% of the pixels are saturated. If none of the patches satisfy this criteria, one of the patches can be returned (e.g., a randomly selected patch of the 10 patches, a patch with the most saturated pixels, etc.). In some embodiments, such a patch selection strategy can prevent the neural network from only learning to output a copy of the CMOS image. Additionally, in some embodiments, a random horizontal and/or vertical flip can be applied to the patch.

As shown in FIG. 5, in some embodiments, a resize-convolution upsampling operator (e.g., up 2×+conv 3×3+ReLU) can be used, which can mitigate checkerboard artifacts.

In some embodiments, the dataset (e.g., including the simulated images) can be divided into training, validation, and test sets. The training and validation sets can include a subset of simulated images (e.g., about ⅔ of the image) that can be split 80/20 into the training and validation sets. For example, results described below were generated using the images from Poly Haven. The test set can include a separate set of images (e.g., the remaining third of image). For example, results described below were generated using the images used in Funt et al.

In some embodiments, weights of the CMOS encoder can be initialized to pre-trained VGG-16 weights and the SPC encoder and sensor fusion decoder can be initialized using any suitable values (e.g., PyTorch's default initialization).

The results described below were generated using models that were trained using the ADAM optimizer with default parameters and a batch size of 16. The model was trained for 2000 epochs until convergence using a multi-step learning rate schedule where the learning rate starts at $10^{-3}$, and every 500 epochs is reduced by a factor of 0.8. However, these are merely examples, and other parameters, batch sizes, number of epochs, and learning rates can be used.

Figure 6:
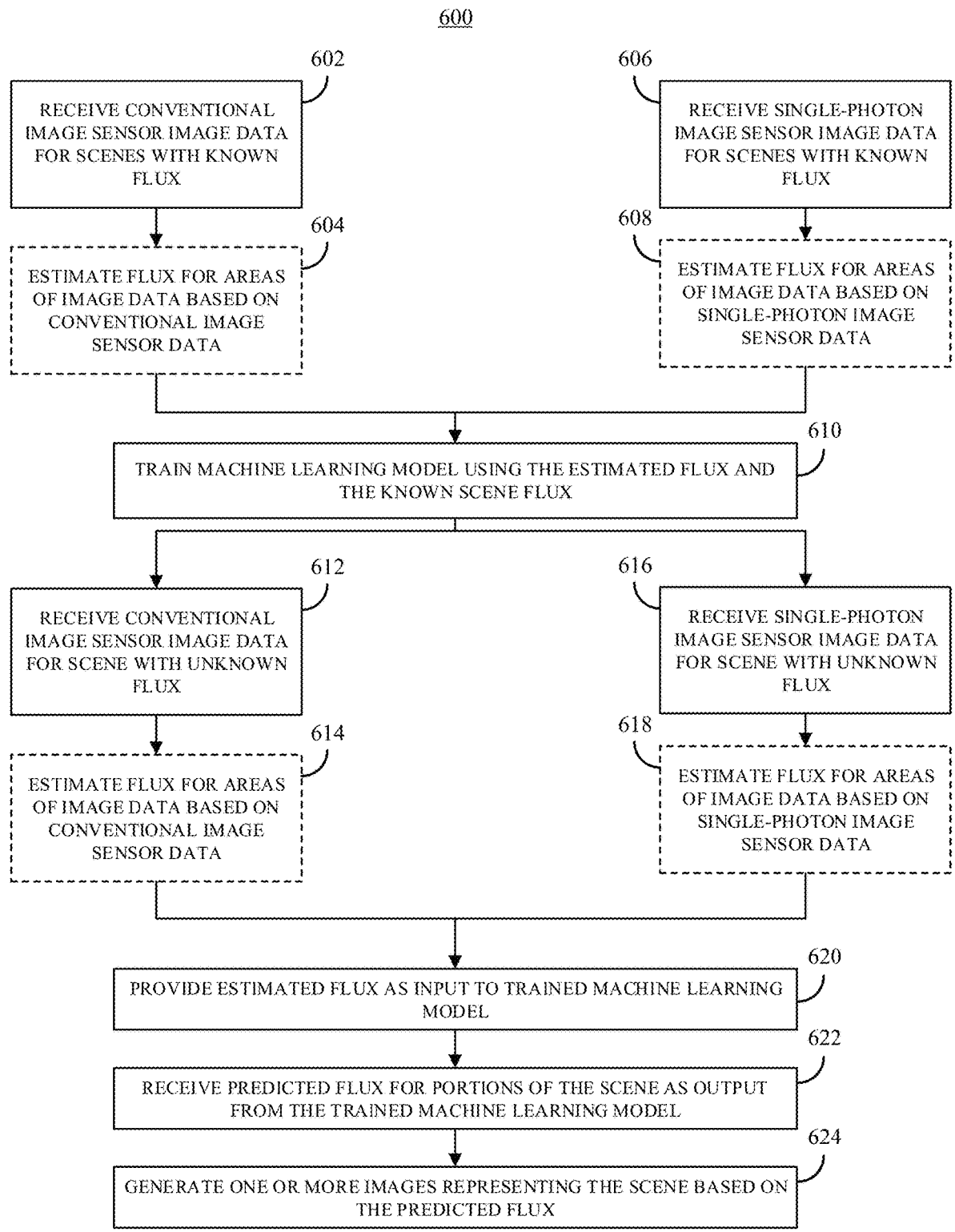
FIG. 6 shows an example of a process for high dynamic range imaging using single-photon and conventional image sensor data in accordance with some embodiments of the disclosed subject matter.

FIG. 6 shows an example of a process for high dynamic range imaging using single-photon and conventional image sensor data in accordance with some embodiments of the disclosed subject matter.

At 602, process 600 can receive conventional image sensor image data for scenes with known flux. For example, process 600 can receive CMOS image sensor data. As another example, process 600 can receive CCD image sensor data. As described above, in some embodiments, process 600 can generate simulated CMOS image sensor data at 602 based on received ground truth photon flux values.

At 604, process 600 can estimate flux for various areas of conventional image sensor image data (e.g., image pixels) based on the conventional image sensor data received at 602. In some embodiments, process 600 can use any suitable technique or combination of techniques to estimate the flux. For example, process 600 can use techniques described above in connection with EQ. (3) to estimate the flux at each pixel. In some embodiment, process 600 can omit 604. For example, if the conventional image sensor data received at 602 is formatted as an estimated flux, rather than a CMOS intensity value, process 600 can omit 604.

At 606, process 600 can receive single-photon image sensor image data for scenes with known flux. For example, process 600 can receive SPAD image sensor data. As another example, process 600 can receive jot image sensor data. As described above, in some embodiments, process 600 can generate simulated SPC image sensor data at 606 based on received ground truth photon flux values.

At 608, process 600 can estimate flux for various areas of single-photon image sensor image data (e.g., image pixels) based on the single-photon image sensor data received at 606. In some embodiments, process 600 can use any suitable technique or combination of techniques to estimate the flux. For example, process 600 can use techniques described above in connection with EQ. (6) to estimate the flux at each pixel. In some embodiment, process 600 can omit 608. For example, if the SPC image sensor data received at 606 is formatted as an estimated flux, rather than a photon count, process 600 can omit 608.

At 610, process 600 can train a machine learning model (e.g., a U-net based neural network) using the estimated flux values for the CMOS and SPC images and the known flux associated with the ground truth image using any suitable technique or combination of techniques. In some embodiments, process 600 can use techniques described above in connection with FIG. 5 to train the machine learning model. For example, as described above, in some embodiments, process 600 can use the loss function represented in EQ. (11) to train the machine learning model. As another example, in some embodiments, process use the loss function represented in EQ. (9) to train the machine learning model.

At 612, process 600 can receive conventional image sensor data for a scene with unknown flux. In some embodiments, process 600 can receive the conventional image sensor data from any suitable source. For example, process 600 can receive the conventional image sensor data from an image sensor of image data source 202 (e.g., a CMOS image sensor, a CCD image sensor, CMOS pixels of a hybrid image sensor, etc.). As another example, process 600 can receive the conventional image sensor data from memory of image data source 202 (e.g., locally from memory 332, from memory 332 via communication network 208, etc.).

At 614, process 600 can estimate flux for various areas of conventional image sensor image data (e.g., image pixels) based on the conventional image sensor data received at 612. In some embodiments, process 600 can use any suitable technique or combination of techniques to estimate the flux. For example, process 600 can use techniques described above in connection with EQ. (3) to estimate the flux at each pixel. In some embodiment, process 600 can omit 614. For example, if the conventional image sensor data received at 612 is formatted as an estimated flux, rather than an intensity value, process 600 can omit 614.

At 616, process 600 can receive single-photon image sensor image data for a scene with unknown flux. For example, process 600 can receive SPAD image sensor data of the same scene with unknown flux that is represented by the conventional image sensor data received at 612. As another example, process 600 can receive jot image sensor data of the same scene with unknown flux that is represented by the conventional image sensor data received at 612.

At 618, process 600 can estimate flux for various areas of single-photon image sensor image data (e.g., image pixels) based on the single-photon image sensor data received at 616. In some embodiments, process 600 can use any suitable technique or combination of techniques to estimate the flux. For example, process 600 can use techniques described above in connection with EQ. (6) to estimate the flux at each pixel. In some embodiment, process 600 can omit 618. For example, if the SPC image sensor data received at 616 is formatted as an estimated flux, rather than a photon count, process 600 can omit 618.

In some embodiments, process 600 can scale the received image data (e.g., received at 612 and/or 616) prior to, or after, estimating the flux, such that the size ratio of conventional image data and single-photon image data corresponds to the ratio used to train the machine learning model.

At 620, process 600 can provide flux values corresponding to the conventional image sensor image data received at 612 and the single-photon image sensor image data received at 616 as input to the trained machine learning model.

At 622, process 600 can receive predicted flux values for portions (e.g., pixels) of the scene (e.g., pixels) as output from the trained machine learning model. In some embodiments, the output can have the same resolution as the input conventional image data (e.g., as shown in FIG. 5).

At 624, process 600 can generate one or more images representing the scene based on the predicted flux received at 622 using any suitable technique or combination of techniques. For example, in some embodiments, process 600 can generate brightness values based on the predicted flux values. In some embodiments, photon flux can be mapped to discrete brightness values using any suitable technique or combination of techniques. For example, process 600 can use the photon flux to estimate scene brightness as a floating-point number (e.g., representing an absolute brightness level that can be represented in lux or watts per square meter), which can be used to represent scene brightness at that point (e.g., either alone or in combination with other information, such as in the RGBE format). As another example, photon flux can be used to estimate scene brightness as a floating-point number, and this value can be used with one or more tone mapping techniques and color information to convert the floating point number to an 8 or 16-bit RGB bitmap image. In a more particular example, an estimated flux values can be converted from a large floating point value (e.g., 32 bit floating point values) to 8 or 16 bits using the TonemapDrago function available from OpenCV with gamma and saturation parameters set to 1.0.

In some embodiments, process 600 can utilize the one or more images generated at 624 for any suitable purpose. For example, process 600 can cause the one or more images to be presented via a display (e.g., display 330, display 304, display 314). As another example, process 600 can use the one or more images in a computer vision application (e.g., object detection and/or recognition).

Figure 7:
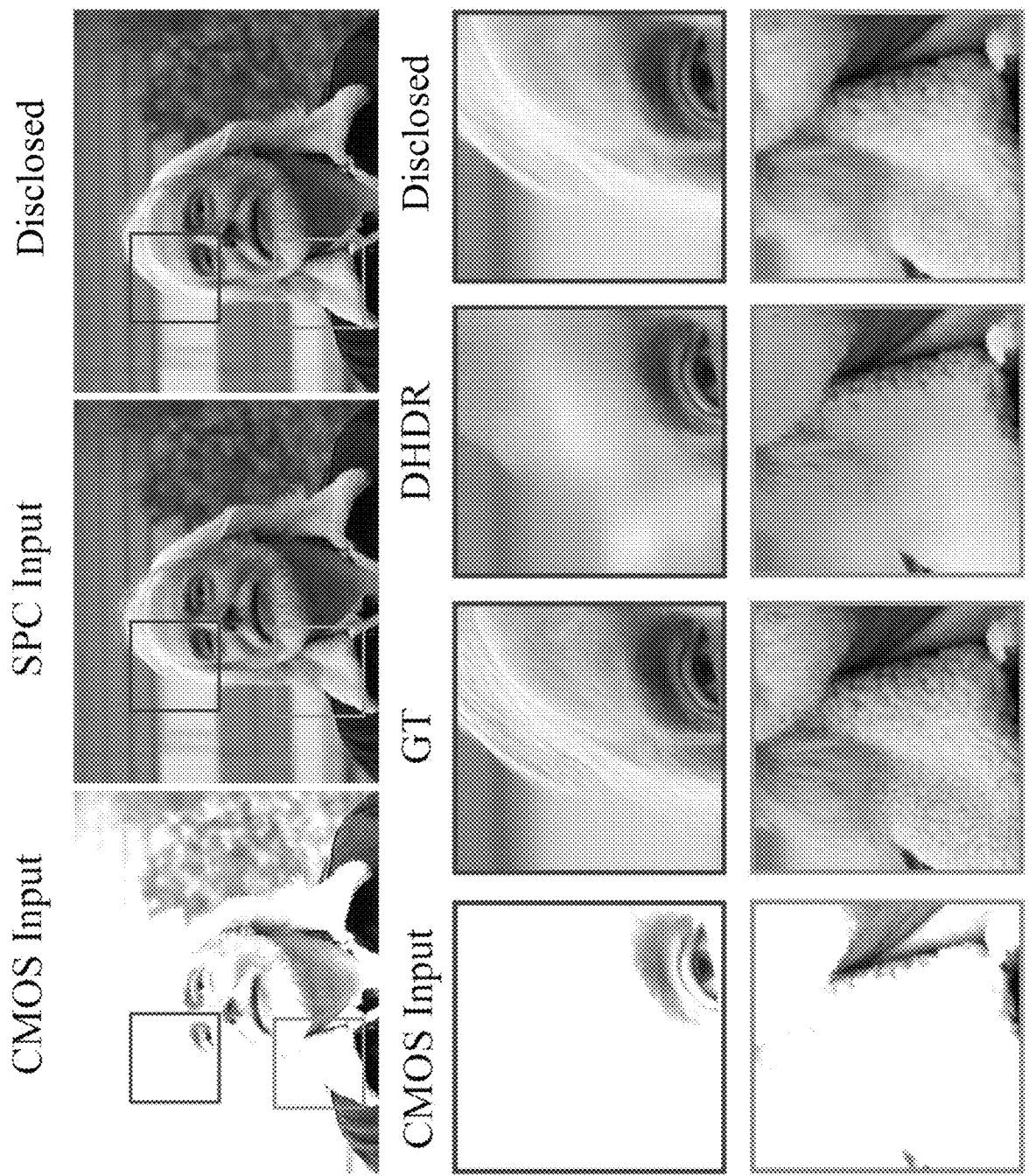
FIG. 7 shows an example of a CMOS image of a scene, a single-photon sensor image of the scene, a high dynamic range image of the scene generated using mechanisms described herein, and portions of the scene generated using another technique.

FIG. 7 shows an example of a CMOS image of a scene, a single-photon sensor image of the scene, a high dynamic range image of the scene generated using mechanisms described herein, and portions of the scene generated using another technique. In FIGS. 7-11, image data generated using mechanisms described herein is shown and image data processed using various other techniques is also shown. For example, results labeled DHDR were generated from a single image (e.g., a single conventional CMOS image) using a trained convolutional neural network described in Santos et al., "Single image hdr reconstruction using a cnn with masked features and perceptual loss," arXiv preprint arXiv:2005.07335 (2020). As another example, results labeled ExpandNet were generated from a single image (e.g., a single conventional CMOS image) using a trained convolutional neural network described in Marnerides et al., "Expandnet: A deep convolutional neural network for high dynamic range expansion from low dynamic range content," in Computer Graphics Forum (2018). As yet another example, results labeled ESRGAN were generated using a technique described in Wang et al., "Esgran: Enhanced super-resolution generative adversarial networks," arXiv preprint arXiv:1809.00219 (2018). As still another example, results labeled Laplacian Blending were generated using an algorithmic blending of an ES-RGAN super-resolved SPC image and a CMOS image using a technique described in Burt et al., "A multiresolution spline with application to image mosaics," ACM transactions on Graphics (1983). As a further example, results labeled Dual-Exposure Bracketing were generated by fusing two CMOS images with a short and a long exposure (0.001 millisecond (ms) and 10 ms), using a last-sample-before-saturation approach.

To generate the DHDR and ExpandNet results. the estimated CMOS photon flux images ($\hat{\Phi}^{CMOS}$) were scaled to [0,1], gamma-compression ($\gamma=0.5$) was applied, and the data was re-scaled to an 8-bit image. Since DHDR and ExpandNet are trained with RGB data, both rely on inter-channel information, and therefore the R/B channels were not dropped for these models. ESRGAN takes as input tone-mapped images scaled between [0, 1]. To generate appropriate inputs, $\mu$-compression can be applied to the estimated SPC photon flux images ($\hat{\Phi}^{SPC}$) which can then be scaled to [0, 1]. Finally, for the output images of DHDR, ExpandNet, and ESRGAN, the pre-processing described above was reverted to produce corresponding linear photon flux images. This can ensure that all visual comparisons use the same visualization pipeline which operates on photon flux images.

Figure 8:
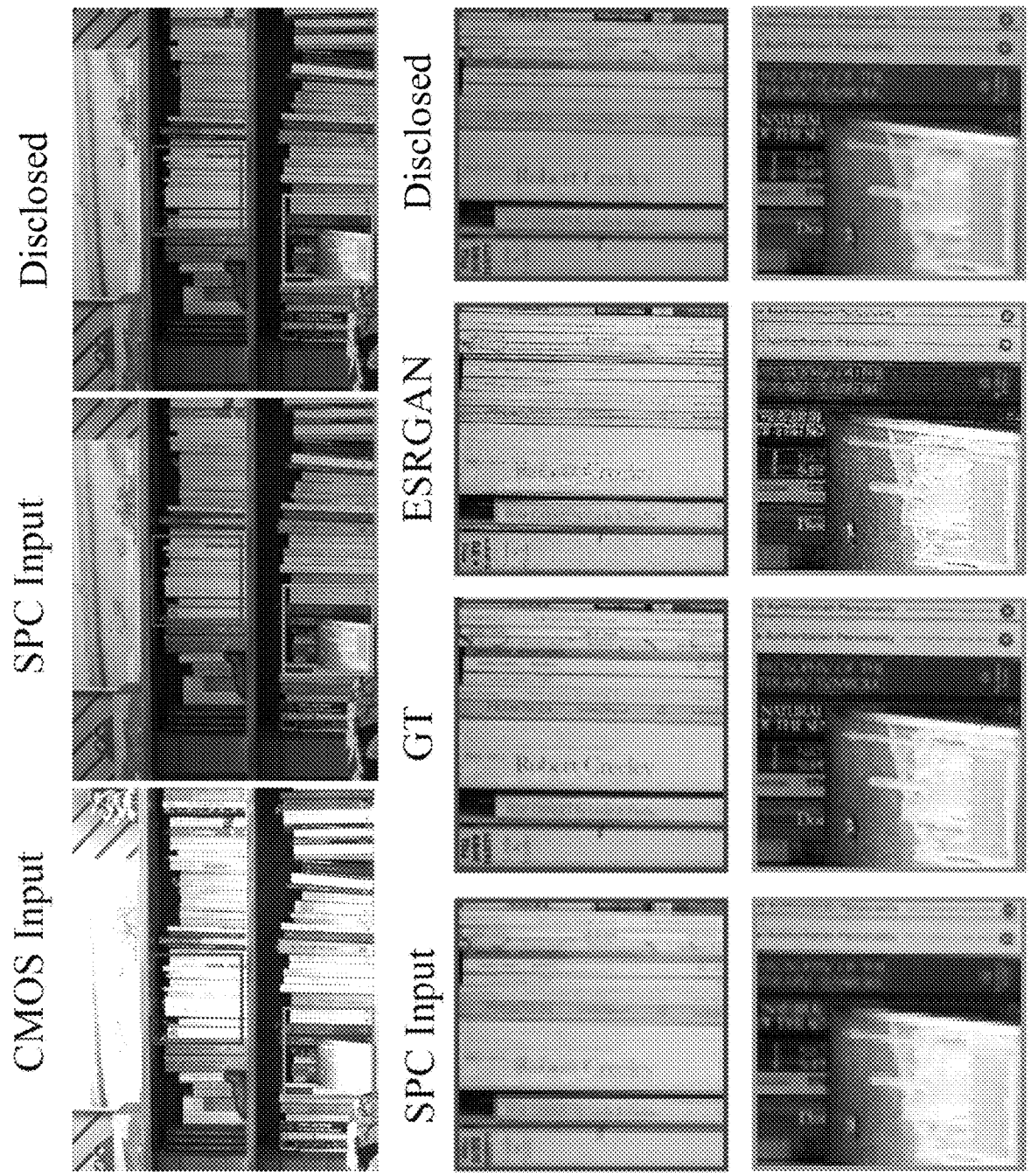
FIG. 8 shows an example of a CMOS image of a second scene, a single-photon sensor image of the second scene, a high dynamic range image of the second scene generated using mechanisms described herein, and portions of the second scene generated using yet another technique.
Figure 9:
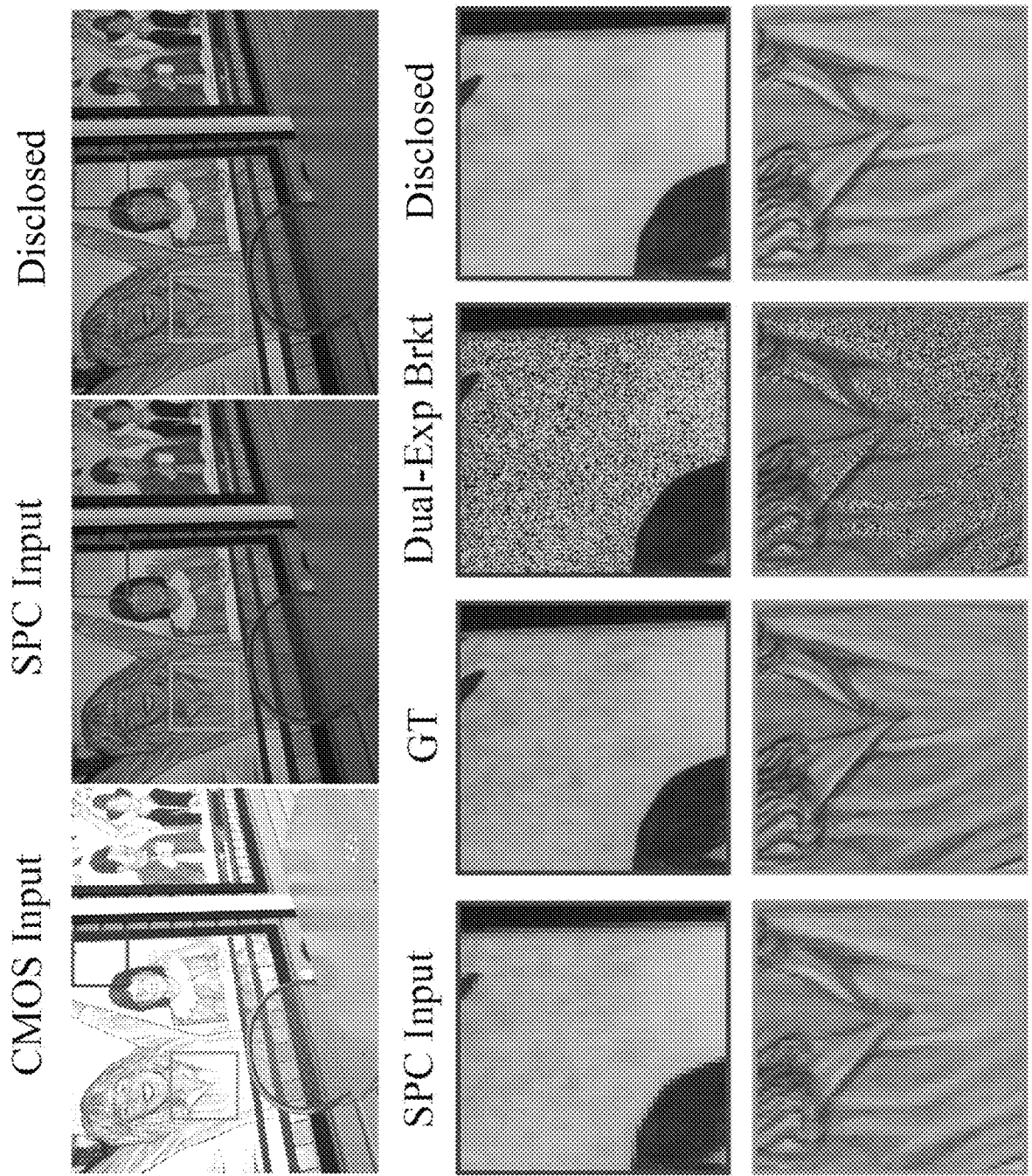
FIG. 9 shows an example of a CMOS image of a third scene, a single-photon sensor image of the third scene, a high dynamic range image of the third scene generated using mechanisms described herein, and portions of the third scene generated using yet another technique.

For visual comparisons between high dynamic range images generated using mechanisms described herein and the various other techniques (e.g., as shown in FIGS. 7-9), we all images were tone mapped to 16-bit portable network graphics (PNG) formatted images using the TonemapDrago function available from OpenCV with gamma and saturation parameters set to 1.0. Additionally, equal exposure and contrast adjustments were applied to the crops shown to highlight the details.

FIG. 7 shows a comparison of mechanisms described herein to a state-of-the-art single-image HDR network, DHDR. In first row of cropped images, DHDR fails to recover both the contour and texture of the forehead and hair. As shown in the second row of cropped images, not only is the cotton-like texture on the collar missing in the image produced by DHDR, but the hallucinated texture of the beard also incorrectly mimics the pattern found on the edge of the collar. These hallucinated image segments are not acceptable in safety-critical applications. FIG. 7 suggests that single-image HDR techniques are unable to recover extreme HDR images because of insufficient contextual information in the saturated regions that these models can use to in-paint them, resulting in image patches that either lack texture or contain textures that deviate from the ground truth. In contrast, the image generated using mechanisms described herein (labeled "disclosed") utilizes the true low-resolution HDR information from the SPC sensor to guide the dynamic range extension, rendering not only visually pleasing images, but also images that are consistent with the genuine physical appearance of the scene. Additional examples are included in Appendix A, which was incorporated by reference herein.

FIG. 8 shows an example of a CMOS image of a second scene, a single-photon sensor image of the second scene, a high dynamic range image of the second scene generated using mechanisms described herein, and portions of the second scene generated using yet another technique. FIG. 8 shows a comparison of mechanisms described herein to ESRGAN, a recent single-image super-resolution model. At first glance, ESRGAN appears to produce sharp, high-contrast images. However, ESRGAN achieves such sharpness at the cost of introducing non-existent high-frequency patterns and textures. For instance, ESRGAN introduces artificial film grain-like texture on the metal plate (e.g., as shown in the second row of cropped images). additionally, ESRGAN fails to recover structured fine details, such as text (e.g., as shown in the first row of cropped images), which are likely to be essential features for some downstream computer vision tasks. The image produced using mechanisms described herein uses the unsaturated high-resolution CMOS data to retain image details, such as the flower-like patterns at the bottom right of the cropped image in the second row of cropped images. Even in regions where the CMOS image is completely over-exposed, the model implemented in accordance with some embodiments of the disclosed subject matter did a good job super-resolving the SPC image free of any hallucinated high-frequency artifacts, and effectively recovered structured details such as text more accurately than ESRGAN. Please refer to the supplementary document for additional comparisons.

FIG. 9 shows an example of a CMOS image of a third scene, a single-photon sensor image of the third scene, a high dynamic range image of the third scene generated using mechanisms described herein, and portions of the third scene generated using yet another technique. FIG. 9 shows a comparison of mechanisms described herein with dual-exposure bracketing. For dual-exposure bracketing, an SNR dip visually translates to non-uniform regions in the merged image where the noise level suddenly increases, leading to a reduction in image quality. For example, in the first row of cropped images, the smooth bright and dark spots on the wall are occluded by noise in the dual-exposure bracketing image, making it difficult to use denoising techniques on such features. Additionally, as shown in the second row of cropped images such discontinuities in SNR levels can be spatially complex and fragmented, introducing additional denoising challenges. In the implementation of mechanisms described herein used to generate the image in FIG. 9 the SPC and CMOS exposures were both 10 ms, and the SNR levels of the two sensors approximately match across the image, despite increases in brightness that may saturate the CMOS image. By maintaining high and uniform SNR, mechanisms described herein can produce relatively clean (e.g., low noise) images with important details across brightness levels, which suggests that mechanisms described herein that use information from both conventional image data and image data generated by a single-photon sensor can produce superior results compared to a CMOS-CMOS hybrid in extreme HDR settings. Additional examples are included in Appendix A, which was incorporated by reference herein.

Figure 10:
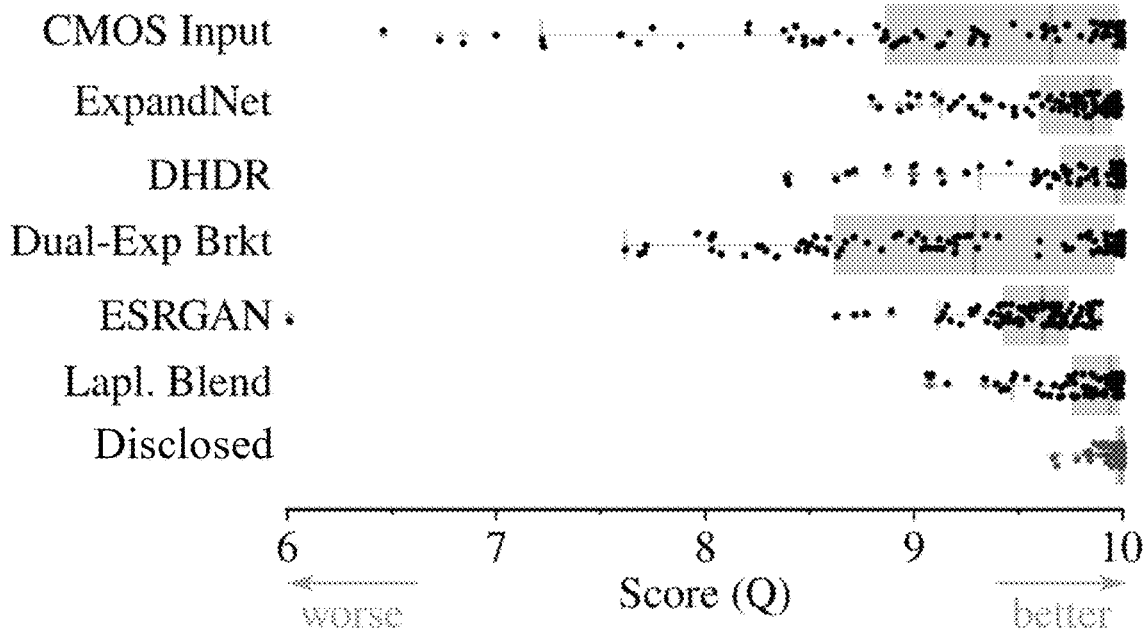
FIG. 10 shows examples of qualitative metrics of performance for images generated using mechanisms described herein and various other techniques.
Figure 10:
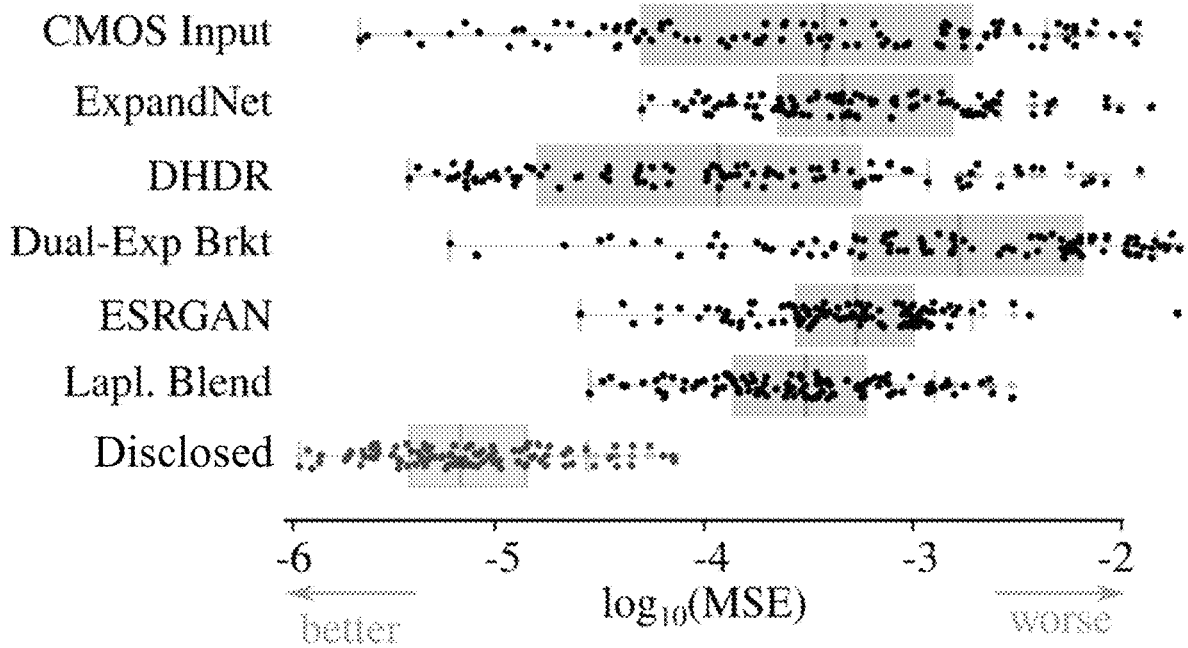

FIG. 10 shows examples of qualitative metrics of performance for images generated using mechanisms described herein and various other techniques. FIG. 10 shows HDR-VDP3 and mean-squared error (MSE) scores for each image in the test set (including images from the Funt et al. HDR dataset). Images with minimal extreme flux regions, achieve high HDR-VDP3 scores in all techniques that use CMOS as an input. Although, Expand-Net and DHDR mostly mitigate extremely low HDR-VDP3 scores, models with SPC inputs are better at preventing these outliers and produce more consistent scores through-out the dataset. The poor performance of dual-exposure bracketing in both metrics suggest that these metrics penalize low SNR heavier than saturation. While DHDR is able to achieve comparable median HDR-VDP3 and MSE scores than Laplacian blending, despite only using a single-image, Laplacian blending does a better job at preventing outliers with very poor image quality. Overall, techniques implemented using mechanisms described herein consistently outperform the other techniques by a significant margin.

Multiple different models were implemented in accordance with some embodiments of the disclosed subject matter to evaluate the performance contribution(s) of different component of the neural network and data source(s). In particular, the performance of the following ablation models were evaluated: Model (M1) uses a single CMOS input image to generate an HDR output and relies on the back-bone U-Net shown in FIG. 5, without the SPC encoder; model (M2) concatenates SPAD features to the decoder network shown in FIG. 5; and model (M3) introduces attention gates in the decoder network in addition to the SPAD input of (M2). The median HDR-VDP3 quality scores for the three models computed on the validation set are 9.68, 9.99, and 9.98 and median µ-compressed MSE values are $5.25 \times 10^{-4}$, $2.95 \times 10^{-5}$, and $4.14 \times 10^{-5}$. Based on the preceding, model (M2) was used to generate the results shown in FIGS. 7-11. Additional metrics and qualitative visual comparisons related to ablation models are described in Appendix A, which has been incorporated by reference herein.

FIG. 11 shows examples of images generated using mechanisms described herein and various other techniques and images generated using various other techniques. An experimental CMOS-SPC system was implemented and used to generate image pairs. However, the images were not aligned due to a relatively large physical distance between the sensors in the experimental system, and each sensor was subject particular optical parameters (e.g., different focal length and aberrations). To mitigate the differences, small overlapping crops were manually selected from each image and registered by estimating an affine transformation using MATLAB's imregtform function. The approximately aligned crops shown in the first and second rows of FIG. 11 are 84×73 and 71×71, respectively. Additionally, the CMOS and SPC crops were bilinearly re-sampled such that the dimensions were 256×256 and 64×64.

The CMOS and SPC data was downloaded and pre-processed as described above, and was provided as input to a machine learning model trained as described above in connection with FIG. 5. FIG. 11 shows the selected pre-processed image crops with extreme dynamic range (CMOS and SPC columns) that were used as input for the evaluated models. The SPC images had a 5 ms exposure. The CMOS inputs (first column) have exposure times of 0.1 ms (first row) and 0.5 ms (second row). Note that, unlike the simulated data described above, the exposure times between CMOS and SPC were chosen not to match because using higher exposures for CMOS would have led to fully saturated images. Similar to the description of results for simulated data, DHDR failed to recover fine structures in the saturated CMOS regions (e.g., fire department text). Additionally, exposure bracketing, despite using 6 exposures ranging from 0.005 ms to 5 ms, was still unable to recover the thin wires of the lamp (shown in the first row). Due to imperfect alignment of the CMOS and SPC crops, the output of the model generated blurred details in both images (lamp details and fire department text). However, these features are visible in the image generated using mechanisms described herein, and were not completely suppressed by the CMOS saturation limit. Additionally, note that in FIG. 11 the CMOS and SPC image crops were derived from similar spatial resolutions, therefore, the CMOS crop does not contain any additional spatial information that can be used by the model. Additional simulation results and images of the scenes used to generate the results in FIGS. 7-11 are described in Appendix A, which has been incorporated by reference herein.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as RAM, Flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, or any suitable media that is fleeting and devoid of any semblance of permanence during transmission, and/or any suitable intangible media.

It should be noted that, as used herein, the term mechanism can encompass hardware, software, firmware, or any suitable combination thereof.

It should be understood that the above described steps of the process of FIG. 6 can be executed or performed in any suitable order or sequence not limited to the order and sequence shown and described in the figures. Also, some of the above steps of the process of FIG. 6 can be executed or performed substantially simultaneously where appropriate or in parallel to reduce latency and processing times.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways.

What is claimed is:

1. A system for generating high dynamic range digital images, comprising:
    a first plurality of detectors, each configured to detect a level of photons arriving at the detector that is proportional to an incident photon flux at the detector, the first plurality of detectors arranged in a first array;
    a second plurality of detectors, each configured to detect arrival of individual photons, the second plurality of detectors arranged in a second array;
    at least one processor that is programmed to:
        receive, from the first plurality of detectors, first image data comprising a first plurality of values each indicative of photon flux from a portion of a scene corresponding to a respective detector of the first plurality of detectors,
            wherein the first image data has a first resolution;
        receive, from the second plurality of detectors, second image data comprising a second plurality of values each indicative of photon flux from a portion of the scene corresponding to a respective detector of the second plurality of detectors,
            wherein the second image data has a second resolution that is lower than the first resolution;
        provide, as input to a first encoder of a trained machine learning model, a first plurality of flux values based on the first plurality of values,
            wherein the trained machine learning model comprises the first encoder, a second encoder, and a decoder;
        provide, as input to the second encoder of the trained machine learning model, a second plurality of flux values based on the second plurality of values;
        receive, as output from the trained machine learning model, a third plurality of values each indicative of photon flux from a portion of the scene corresponding to a respective detector of the first plurality of detectors; and
        generate a high dynamic range image based on the third plurality of values.

2. The system of claim 1, further comprising a CMOS image sensor that includes the first plurality of detectors.

3. The system of claim 1, wherein each detector of the second plurality of detectors comprises a single-photon detector.

4. The system of claim 3, wherein each single-photon detector is configured to record a number of photons detected within an exposure time.

5. The system of claim 1, wherein the first resolution is at least four times greater than the second resolution.

6. The system of claim 1, wherein the trained machine learning model includes a first skip connection between a layer of the first encoder and a layer of the decoder, and a second skip connection between a layer of the second encoder and the layer of the decoder, wherein the trained machine learning model is configured to concatenate values from the layer of the first encoder and values from the layer of the second encoder.

7. The system of claim 1, wherein the at least one processor is further programmed to:
    estimate the first plurality of flux values using the first plurality of values and the relationship:

$$\hat{\Phi}^{CMOS} = \frac{\hat{N}_T^{CMOS}}{q_{CMOS}T},$$

where $\hat{\Phi}^{CMOS}$ is the estimated flux for the portion of the scene, $\hat{N}_T^{CMOS}$ is a value output by a detector of the first plurality of detectors, $q_{CMOS}$ is a sensitivity of the detector, and T is exposure time; and
    estimate the second plurality of flux values using the second plurality of values and the relationship:

$$\hat{\Phi}^{SPC} = \frac{\hat{N}_{T_{SPC}}^{SPC}/q_{SPAD}}{T_{SPC} - \tau_d \hat{N}_{T_{SPC}}^{SPC}},$$

where $\hat{\Phi}^{SPC}$ is the estimated flux for the portion of the scene, $T_{SPC}$ is exposure time, $\hat{N}_{T_{SPC}}^{SPC}$ is a photon count corresponding to a number of photon detections in exposure time $T_{SPC}$, $q_{SPAD}$ is a sensitivity of the detector, and $\tau_d$ is a dead time of the detector.

8. A method for generating high dynamic range digital images, comprising:
    receiving, from a first plurality of detectors, first image data comprising a first plurality of values each indicative of photon flux from a portion of a scene corresponding to a respective detector of the first plurality of detectors, wherein the first image data has a first resolution, each of the detectors of the first plurality of detectors is configured to detect a level of photons arriving at the detector that is proportional to an incident photon flux at the detector, and the first plurality of detectors are arranged in a first array;

receive, from a second plurality of detectors, second image data comprising a second plurality of values each indicative of photon flux from a portion of the scene corresponding to a respective detector of the second plurality of detectors, wherein the second image data has a second resolution that is lower than the first resolution, each of the detectors of the second plurality of detectors is configured to configured to detect arrival of individual photons, and the second plurality of detectors are arranged in a second array;

providing, as input to a first encoder of a trained machine learning model, a first plurality of flux values based on the second plurality of values, wherein the trained machine learning model comprises the first encoder, a second encoder, and a decoder;

providing, as input to the second encoder of the trained machine learning model, a second plurality of flux values based on the first plurality of values;

receiving, as output from the trained machine learning model, a third plurality of values each indicative of photon flux from a portion of the scene corresponding to a respective detector of the first plurality of detectors; and generating a high dynamic range image based on the third plurality of values.

9. The method of claim 8, wherein the first plurality of detectors are included in a CMOS image sensor.

10. The method of claim 8, wherein each detector of the second plurality of detectors comprises a single-photon detectors.

11. The method of claim 10, wherein each single-photon detectors is configured to record a number of photons detected within an exposure time.

12. The method of claim 8, wherein the first resolution is at least four times greater than the second resolution.

13. The method of claim 8, wherein the trained machine learning model includes a first skip connection between a layer of the first encoder and a layer of the decoder, and a second skip connection between a layer of the second encoder and the layer of the decoder, wherein the trained machine learning model is configured to concatenate values from the layer of the first encoder and values from the layer of the second encoder.

14. The method of claim 8, further comprising:

estimating the first plurality of flux values using the first plurality of values and the relationship:

$$\hat{\Phi}^{CMOS} = \frac{\hat{N}_T^{CMOS}}{q_{CMOS}T},$$

where $\hat{\Phi}^{CMOS}$ is the estimated flux for the portion of the scene, $\hat{N}^{CMOS}_T$ is a value output by a detector of the first plurality of detectors, $q_{CMOS}$ is a sensitivity of the detector, and T is exposure time; and estimating the second plurality of flux values using the second plurality of values and the relationship:

$$\hat{\Phi}^{SPC} = \frac{\hat{N}^{SPC}_{T_{SPC}}/q_{SPAD}}{T_{SPC} - \tau_d \hat{N}^{SPC}_{T_{SPC}}},$$

where $\hat{\Phi}^{SPC}$ is the estimated flux for the portion of the scene, $T_{SPC}$ is exposure time, $\hat{N}^{SPC}_{T_{SPC}}$ is a photon count corresponding to a number of photon detections in exposure time $T_{SPC}$, $q_{SPAD}$ is a sensitivity of the detector, and $\tau_d$ is a dead time of the detector.

15. A non-transitory computer readable medium containing computer executable instructions that, when executed by a processor, cause the processor to perform a method for generating high dynamic range digital images, the method comprising:

receiving, from a first plurality of detectors, first image data comprising a first plurality of values each indicative of photon flux from a portion of a scene corresponding to a respective detector of the first plurality of detectors, wherein the first image data has a first resolution, each of the detectors of the first plurality of detectors is configured to detect a level of photons arriving at the detector that is proportional to an incident photon flux at the detector, and the first plurality of detectors are arranged in a first array;

receive, from a second plurality of detectors, second image data comprising a second plurality of values each indicative of photon flux from a portion of the scene corresponding to a respective detector of the second plurality of detectors, wherein the second image data has a second resolution that is lower than the first resolution, each of the detectors of the second plurality of detectors is configured to configured to detect arrival of individual photons, and the second plurality of detectors are arranged in a second array;

providing, as input to a first encoder of a trained machine learning model, a first plurality of flux values based on the first plurality of values, wherein the trained machine learning model comprises the first encoder, a second encoder, and a decoder;

providing, as input to the second encoder of the trained machine learning model, a second plurality of flux values based on the second plurality of values;

receiving, as output from the trained machine learning model, a third plurality of values each indicative of photon flux from a portion of the scene corresponding to a respective detector of the first plurality of detectors; and generating a high dynamic range image based on the third plurality of values.

16. The non-transitory computer readable medium of claim 15, wherein the first plurality of detectors are included in a CMOS image sensor.

17. The non-transitory computer readable medium of claim 15, wherein each detector of the second plurality of detectors comprises a single-photon detector.

18. The non-transitory computer readable medium of claim 17, wherein each single-photon detector is configured to record a number of photons detected within an exposure time.

19. The non-transitory computer readable medium of claim 15, wherein the first resolution is at least four times greater than the second resolution.

20. The non-transitory computer readable medium of claim 15, wherein the trained machine learning model includes a first skip connection between a layer of the first encoder and a layer of the decoder, and a second skip connection between a layer of the second encoder and the layer of the decoder, wherein the trained machine learning model is configured to concatenate values from the layer of the first encoder and values from the layer of the second encoder.

21. The non-transitory computer readable medium of claim 15, wherein the method further comprises:
estimating the first plurality of flux values using the first plurality of values and the relationship:

$$\hat{\Phi}^{CMOS} = \frac{\hat{N}_T^{CMOS}}{q_{CMOS}T},$$

where $\hat{\Phi}^{CMOS}$ is the estimated flux for the portion of the scene, $\hat{\Phi}^{CMOS}{}_T$ is a value output by a detector of the first plurality of detectors, $q_{CMOS}$ is a sensitivity of the detector, and T is exposure time; and
estimating the second plurality of flux values using the second plurality of values and the relationship:

$$\hat{\Phi}^{SPC} = \frac{\hat{N}_{T_{SPC}}^{SPC}/q_{SPAD}}{T_{SPC} - \tau_d \hat{N}_{T_{SPC}}^{SPC}},$$

where $\hat{\Phi}^{SPC}$ is the estimated flux for the portion of the scene, $T_{SPC}$ is exposure time, $\hat{N}^{SPC}{}_{T_{SPC}}$ is a photon count corresponding to a number of photon detections in exposure time $T_{SPC}$, $q_{SPAD}$ is a sensitivity of the detector, and $\tau_d$ is a dead time of the detector.

* * * * *

UNITED STATES PATENT AND TRADEMARK OFFICE
CERTIFICATE OF CORRECTION

PATENT NO. : 11,758,297 B2
APPLICATION NO. : 17/572236
DATED : September 12, 2023
INVENTOR(S) : Felipe Gutierrez Barragan et al.

It is certified that error appears in the above-identified patent and that said Letters Patent is hereby corrected as shown below:

In the Specification

Column 2, Line 29, "$N^{CMOS}{}_T$" should be -- $N_T^{CMOS}$ --.

Column 2, Line 41, "$\hat{N}^{SPC} T_{SPC}$" should be -- $\hat{N}^{SPC}_{T_{SPC}}$ --.

Column 6, Line 12, "$N_T{}^{CMOS}$" should be -- $N_T^{CMOS}$ --.

Column 6, Line 16, EQ. (1), "$E[N_T{}^{CMOS}]=q_{CMOS}\Phi T$" should be -- $E\left[N_T^{CMOS}\right] = q_{CMOS}\Phi T$ --.

Column 6, Line 21, EQ. (2), "$Var[N^{CMOS}{}_T]=q^2{}_{CMOS}\Phi^2 T^2$" should be -- $Var\left[N_T^{CMOS}\right] = q^2_{CMOS}\Phi^2 T^2$ --.

Column 6, Line 32, "$\hat{N}^{CMOS}{}_T$" should be -- $\hat{N}_T^{CMOS}$ --.

Column 6, Line 35, "$\hat{N}^{CMOS}{}_T$" should be -- $\hat{N}_T^{CMOS}$ --.

Column 6, Line 46, "$\hat{N}^{CMOS}{}_T$" should be -- $\hat{N}_T^{CMOS}$ --.

Column 6, Line 66, "$\tau_{z,?}$" should be -- $\tau_d$ --.

Column 7, Line 15, "$\hat{N}_T{}^{SPC}$" should be -- $\hat{N}_T^{SPC}$ --.

Signed and Sealed this
Twenty-sixth Day of November, 2024

Katherine Kelly Vidal
*Director of the United States Patent and Trademark Office*

CERTIFICATE OF CORRECTION (continued)
U.S. Pat. No. 11,758,297 B2

Column 7, Line 35, " $\hat{\Phi}^{SPC} = \frac{\hat{N}_T^{SPC}/q_{SPAD}}{t - \tau_d \hat{N}_T^{SPC}}$ " should be -- $\hat{\Phi}^{SPC} = \frac{\hat{N}_T^{SPC}/q_{SPAD}}{t - \tau_d \hat{N}_T^{SPC}}$ (6') --.

Column 7, Line 38, "(6')" should be deleted.

Column 7, Line 43, " $\overline{X} = \frac{1}{N(T)-1} \sum_{i=1}^{N(T)-1} X_i$ " should be -- $\overline{X} = \frac{1}{N(T)-1} \sum_{i=1}^{N(T)-1} X_i$ --.

Column 15, Line 24, EQ. (9), " $L^{l1} = \|\Phi_\mu - \hat{\Phi}_\mu^{Fused}\|$ " should be -- $L_{l1} = \|\Phi_\mu - \hat{\Phi}_\mu^{Fused}\|$ --.

Column 15, Line 32, EQ. (10), " $L_{vgg} = \sum_{i=1}^{N} \left( \|g_i(\Phi_u) - g_i(\hat{\Phi}_\mu^{Fused})\|_2^2 \right)$ " should be -- $L_{vgg} = \sum_{i=1}^{N} \left( \|g_i(\Phi_u) - g_i(\hat{\Phi}_\mu^{Fused})\|_2^2 \right)$ --.

Column 16, Line 17, " $\hat{N}_T^{SPC}$ " should be -- $\hat{N}_T^{SPC}$ --.

In the Claims

Column 24, Claim 7, Line 47, " $\hat{N}_T^{CMOS}$ " should be -- $\hat{N}_T^{CMOS}$ --.

Column 24, Claim 7, Line 60, " $\hat{N}^{SPC} T_{SPC}$ " should be -- $\hat{N}_{T_{SPC}}^{SPC}$ --.

Column 25, Claim 14, Line 67, " $\hat{N}^{CMOS}{}_T$ " should be -- $\hat{N}_T^{CMOS}$ --.

Column 26, Claim 14, Line 12, " $\hat{N}^{SPC} T_{SPC}$ " should be -- $\hat{N}_{T_{SPC}}^{SPC}$ --.